US012710577B2

(12) United States Patent
Tanaka et al.

(10) Patent No.: US 12,710,577 B2
(45) Date of Patent: Aug. 18, 2026

(54) OPTICAL BIAXIALLY STRETCHED PLASTIC FILM, POLARIZING PLATE, IMAGE DISPLAY DEVICE, AND METHOD OF SELECTING OPTICAL BIAXIALLY STRETCHED PLASTIC FILM

(71) Applicant: DAI NIPPON PRINTING CO., LTD., Tokyo (JP)

(72) Inventors: Yoshiko Tanaka, Tokorozawa (JP); Shosei Kubota, Kashiwa (JP); Norio Ishii, Nagareyama (JP); Takashi Kuroda, Moriya (JP); Hiroaki Segawa, Nagareyama (JP); Akinobu Ushiyama, Moriya (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 1112 days.

(21) Appl. No.: 17/764,466

(22) PCT Filed: Sep. 30, 2020

(86) PCT No.: PCT/JP2020/037050
§ 371 (c)(1),
(2) Date: Mar. 28, 2022

(87) PCT Pub. No.: WO2021/065967
PCT Pub. Date: Apr. 8, 2021

(65) Prior Publication Data

US 2022/0342135 A1 Oct. 27, 2022

(30) Foreign Application Priority Data

Sep. 30, 2019 (JP) ................................ 2019-181065

(51) Int. Cl.
*G02B 5/30* (2006.01)
*G02F 1/13363* (2006.01)
*H10K 59/80* (2023.01)

(52) U.S. Cl.
CPC ....... *G02B 5/3083* (2013.01); *G02F 1/13363* (2013.01); *G02F 2413/12* (2013.01); *H10K 59/8791* (2023.02)

(58) Field of Classification Search
CPC ............... G02B 5/3083; G02F 1/13363; G02F 2413/12; H10K 59/8791
(Continued)

(56) References Cited

U.S. PATENT DOCUMENTS 12,216,302 B2 * 2/2025 Kubota ............. G02F 1/133531
2004/0156105 A1 * 8/2004 Trapani ................ G02B 5/3083 359/489.03
(Continued)

FOREIGN PATENT DOCUMENTS

CN 109891281 6/2019
JP 2011-107198 6/2011
(Continued)

OTHER PUBLICATIONS

Notice of Reasons for Refusal issued for Japanese Patent Application No. 2021-551343, Dispatch Date: May 28, 2024, 6 pages including English machine translation.
(Continued)

*Primary Examiner* — Jennifer D. Carruth
(74) *Attorney, Agent, or Firm* — HSML P.C.

(57) ABSTRACT

Provided are an optical biaxially stretched plastic film, a polarizing plate, and an image display device that can suppress blackouts when viewed with polarized sunglasses, polarized goggles or the like without increasing the in-plane phase difference. In addition, a method for selecting an optical biaxially stretched plastic film is provided.
(Continued)

The optical biaxially stretched plastic film has a region satisfying condition 1 and condition 2 below:
<Condition 1>
the difference between a luminance obtained in a specific measurement 1 and a luminance obtained in a specific measurement 2 (L1.n−L2.n) is calculated at each of 100 measurement points, and the "luminance difference variation 3σ" calculated from the luminance differences at the 100 measurement points is 100 or more; and
<Condition 2>
the in-plane phase difference (Re) is 2500 nm or less.

10 Claims, 6 Drawing Sheets

(58) Field of Classification Search
USPC ........................................ 359/489.07, 489.13
See application file for complete search history.

(56) References Cited

U.S. PATENT DOCUMENTS

| | | | | |
|---|---|---|---|---|
| 2004/0183973 | A1* | 9/2004 | Roska | G02B 5/3016 349/117 |
| 2006/0272778 | A1* | 12/2006 | Allen | B29C 55/165 156/494 |
| 2011/0128477 | A1* | 6/2011 | Izaki | H10K 50/844 349/96 |
| 2016/0327719 | A1 | 11/2016 | Kitahara et al. | |
| 2019/0154884 | A1 | 5/2019 | Kim et al. | |
| 2019/0317353 | A1 | 10/2019 | Shim et al. | |
| 2019/0339421 | A1* | 11/2019 | Byun | G02B 5/3025 |
| 2020/0174159 | A1 | 6/2020 | Kimura et al. | |
| 2020/0241173 | A1 | 7/2020 | Byun et al. | |
| 2020/0264357 | A1* | 8/2020 | Yoshinari | G02B 5/3016 |
| 2020/0326587 | A1 | 10/2020 | Heo et al. | |
| 2021/0020870 | A1* | 1/2021 | Osato | G02B 5/3016 |

FOREIGN PATENT DOCUMENTS

| | | | |
|---|---|---|---|
| JP | 2011-112928 | | 6/2011 |
| JP | 4739950 | B2 | 8/2011 |
| JP | 2015194566 | A | 11/2015 |
| JP | 2016190437 | A | 11/2016 |
| JP | 2019-518241 | | 6/2019 |
| JP | 2019151029 | A | 9/2019 |
| KR | 101952364 | B1 | 2/2019 |
| KR | 1020190108969 | A | 9/2019 |
| WO | 2016/059843 | | 4/2016 |
| WO | 2018/143569 | | 8/2018 |
| WO | 2019013078 | A1 | 1/2019 |

OTHER PUBLICATIONS

Request for the Submission of an Opinion issued for Korean Patent Application No. 10-2022-7013816, Dispatched date: Apr. 14, 2025, 14 pages including English machine translation.

Decision of Refusal and Decision of Dismissal of Amendment issued for Japanese Patent Application No. 2021-551343, Dispatch date: Nov. 5, 2024, 6 pages including English machine translation.

International Search Report of PCT/JP2020/037050, Dec. 22, 2020, 7 pages including English translation.

Office Action issued for Japanese Patent Application No. 2021-551343 on Dec. 12, 2023, 9 pages including English translation.

Office Action issued for Taiwanese Patent Application No. 109134167 on Dec. 8, 2023, 22 pages including English translation.

Notice of Reasons for Refusal issued for Japanese Patent Application No. 2025-014010, Dispatch date: Apr. 7, 2026, 12 pages including English machine translation.

* cited by examiner (A)

(B)

(C)

OPTICAL BIAXIALLY STRETCHED PLASTIC FILM, POLARIZING PLATE, IMAGE DISPLAY DEVICE, AND METHOD OF SELECTING OPTICAL BIAXIALLY STRETCHED PLASTIC FILM

TECHNICAL FIELD

The present disclosure relates to an optical biaxially stretched plastic film, a polarizing plate, an image display device, and a method for selecting a biaxially stretched plastic film.

BACKGROUND ART

Liquid crystal display elements and organic EL elements are used in various electronic devices for transmitting information visually. These display elements are not only used indoors, but in recent years, the opportunities for outdoor use have increased due to the spread of smartphones and digital signage.

In liquid crystal display elements, the viewer will visually recognize the light transmitted through the polarizer on the light emitting side. In organic EL elements, the viewer will visually recognize the light transmitted through the polarizer provided on the viewer side to the light emitting layer for antireflection of external light. Therefore, the viewer will visually recognize polarized light in both the liquid crystal display elements and organic EL elements.

When image display devices are used outdoors in this way, there may be opportunities for viewers wearing polarized sunglasses, polarized goggles, or the like to get information by polarized light. At this time, when the vibration plane of the light transmitted through the polarizer on the viewer side is orthogonal to the absorption axis of the polarizer of polarized sunglasses, polarized goggles, or the like, the light emitted from these image display devices is blocked by polarized sunglasses, polarized goggles, or the like, and the viewer is in a so-called blackout state where liquid crystal display elements are visually recognized in total darkness. It is important to eliminate blackouts since polarized sunglasses or polarized goggles may be worn indoors as well as outdoors.

In order to eliminate blackouts, a method using a polymer film in which the angle formed by the absorption axis of the polarizer of a polarizing plate and the slow axis of the polymer film is set to 45 degrees is disclosed (Patent Literature 1).

Patent Literature 1 discloses a liquid crystal display device that can eliminate blackouts when viewed with polarized sunglasses, polarized goggles or the like by using a specific white light source as a light source of the image display device, setting the in-plane phase difference (Re, retardation) of a stretched plastic film to as high as 3000 nm or more and 30000 nm or less, and disposing the absorption axis of the polarizer and the slow axis of the stretched plastic film at substantially 45 degrees.

However, the device of Patent Literature 1 needs to use a stretched plastic film with a large in-plane phase difference. Further, a stretched plastic film with a large in-plane phase difference is generally uniaxially stretched, and therefore problems are that it is easily torn in the stretching direction, and folding habits strongly remain in a direction rectangular to the stretching direction.

CITATION LIST

Patent Literature

PTL 1: JP 2011-107198 A

SUMMARY OF INVENTION

Technical Problem

It is an object of the present disclosure to provide an optical biaxially stretched plastic film, a polarizing plate, and an image display device that can suppress blackouts when viewed with polarized sunglasses, polarized goggles or the like without increasing the in-plane phase difference.

Solution to Problem

As a result of dedicated studies, the inventors have found that the aforementioned problems can be solved by setting the "luminance difference variation 3σ", which will be described below, to 100 or more and the in-plane phase difference (Re) to 2500 nm or less.

The present disclosure provides the following optical biaxially stretched plastic film, a functional film, a polarizing plate, and an image display device using the same, and a method for selecting an optical biaxially stretched plastic film.

[1] An optical biaxially stretched plastic film comprising a region satisfying <Condition 1> and <Condition 2> below:

<Condition 1> a luminance difference between a luminance obtained in measurement 1 and a luminance obtained in measurement 2 (L1.n−L2.n) is calculated at 100 measurement points, and a "luminance difference variation 3σ" calculated from the luminance differences at 100 measurement points is 100 or more;

<<Measurement 1>> a measurement sample 1 is produced by disposing a first polarizer, the optical biaxially stretched plastic film, and a second polarizer in this order on a surface light source; in the measurement sample 1, the slow axis direction of the optical biaxially stretched plastic film is disposed substantially perpendicular to the absorption axis direction of the first polarizer, and the absorption axis of the second polarizer is disposed substantially perpendicular to the absorption axis direction of the first polarizer, the surface light source of the measurement sample 1 is displayed in white, and the luminance of the transmitted light emitted from the second polarizer side is measured in any first region at measurement points of 100 in vertical×100 in horizontal set at equal intervals; and the results at 100 points in any horizontal row are extracted from the measurement results and are sequentially referred to as the first measurement point to the 100th measurement point, and the luminance at the first measurement point is defined as L1.1, the luminance at the 100th measurement point is defined as L1.100, and the luminance at the n-th measurement point is defined as L1.n;

<<Measurement 2>> a measurement sample 2 is produced by disposing the first polarizer and the second polarizer in this order on a surface light source that is the same as the surface light source in the measurement 1; in the measurement sample 2, the absorption axis of the second polarizer is disposed substantially perpendicular to the absorption axis direction of the first polarizer, the surface light source of the measurement sample 2 is displayed in white, and the luminance of the transmitted light emitted from the second polarizer side in a region that substantially coincides with the first measurement region measured at measurement points of 100 in vertical×100 in horizontal set at equal intervals; and the results at 100 points in any horizontal row are extracted from the measurement results and are sequentially referred to as the first measurement point to the 100th measurement point, and the luminance at the first measurement point is defined as L2.1, the luminance at the 100th measurement point is defined as L2.100, and the luminance at the n-th measurement point is defined as L2.n; and <Condition 2> an in-plane phase difference (Re) is 2500 nm or less.

[2] The optical biaxially stretched plastic film according to [1], wherein the in-plane phase difference with respect to a phase difference in the thickness direction is 0.10 or less.

[3] The optical biaxially stretched plastic film according to [1] or [2], having a film thickness of 20 μm or more and 200 μm or less.

[4] A functional film comprising a functional layer on one side of the optical biaxially stretched plastic film according to any one of [1] to [3].

[5] A polarizing plate comprising: a polarizer; a first transparent protective plate disposed on one side of the polarizer; and a second transparent protective plate disposed on the other side of the polarizer, wherein at least one selecting from the group consisting of the first transparent protective plate and the second transparent protective plate is the optical biaxially stretched plastic film according to any one of [1] to [3].

[6] An image display device comprising: a display element; and a plastic film disposed on a light emitting surface side of the display element, wherein the plastic film is the optical biaxially stretched plastic film according to any one of [1] to [3].

[7] The image display device according to [6], further comprising a polarizer between the display element and the plastic film.

[8] The image display device according to [6] or [7], further comprising a functional layer on the side opposite to the display element of the optical biaxially stretched plastic film.

[9] An image display device comprising a display element, and a first polarizer and an optical biaxially stretched plastic film disposed on a light emitting surface of the display element, wherein the slow axis direction of the optical biaxially stretched plastic film is disposed substantially perpendicular to the absorption axis direction of the first polarizer, and the optical biaxially stretched plastic film comprises a region satisfying <Condition 1B> and <Condition 2B>:

<Condition 1B> a luminance difference between a luminance obtained in measurement 1B and a luminance obtained in measurement 2B (L1.n−L2.n) is calculated at 100 measurement points, and a "luminance difference variation 3σ" calculated from the luminance differences at 100 measurement points is 100 or more;

<<Measurement 1B>> a measurement sample 1B is produced by disposing a first polarizer, the optical biaxially stretched plastic film, and a second polarizer in this order on a display element; in the measurement sample 1B, the slow axis direction of the optical biaxially stretched plastic film is disposed substantially perpendicular to the absorption axis direction of the first polarizer, and the absorption axis of the second polarizer is disposed substantially perpendicular to the absorption axis direction of the first polarizer, the display element of the measurement sample 1B is displayed in white, and the luminance of the transmitted light emitted from the second polarizer side is measured in any first region at measurement points of 100 in vertical×100 in horizontal set at equal intervals; and the results at 100 points in any horizontal row are extracted from the measurement results and are sequentially referred to as the first measurement point to the 100th measurement point, and the luminance at the first measurement point is defined as L1.1, the luminance at the 100th measurement point is defined as L1.100, and the luminance at the n-th measurement point is defined as L1.n;

<<Measurement 2B>> a measurement sample 2B is produced by disposing the first polarizer and the second polarizer in this order on a display element that is the same as the display element in the measurement 1B; in the measurement sample 2B, the absorption axis of the second polarizer is disposed substantially perpendicular to the absorption axis direction of the first polarizer, the display element of the measurement sample 2B is displayed in white, and the luminance of the transmitted light emitted from the second polarizer side in a region that substantially coincides with the first measurement region measured at measurement points of 100 in vertical×100 in horizontal set at equal intervals; and the results at 100 points in any horizontal row are extracted from the measurement results and are sequentially referred to as the first measurement point to the 100th measurement point, and the luminance at the first measurement point is defined as L2.1, the luminance at the 100th measurement point is defined as L2.100, and the luminance at the n-th measurement point is defined as L2.n; and <Condition 2B> an in-plane phase difference (Re) is 2500 nm or less.

[10] A method for selecting a biaxially stretched plastic film of an image display device comprising a display element and an optical biaxially stretched plastic film disposed on a surface of a light emitting surface side of the display element, the method comprising selecting an optical biaxially stretched plastic film satisfying a determination condition of comprising a region satisfying Condition 1 and Condition 2.

Advantageous Effects of Invention

The optical biaxially stretched plastic film of the present disclosure, the functional film, the polarizing plate, and the image display device using the optical biaxially stretched plastic film can suppress blackouts when viewed with polarized sunglasses or polarized goggles without increasing the in-plane phase difference.

DESCRIPTION OF EMBODIMENTS

Figure 1:
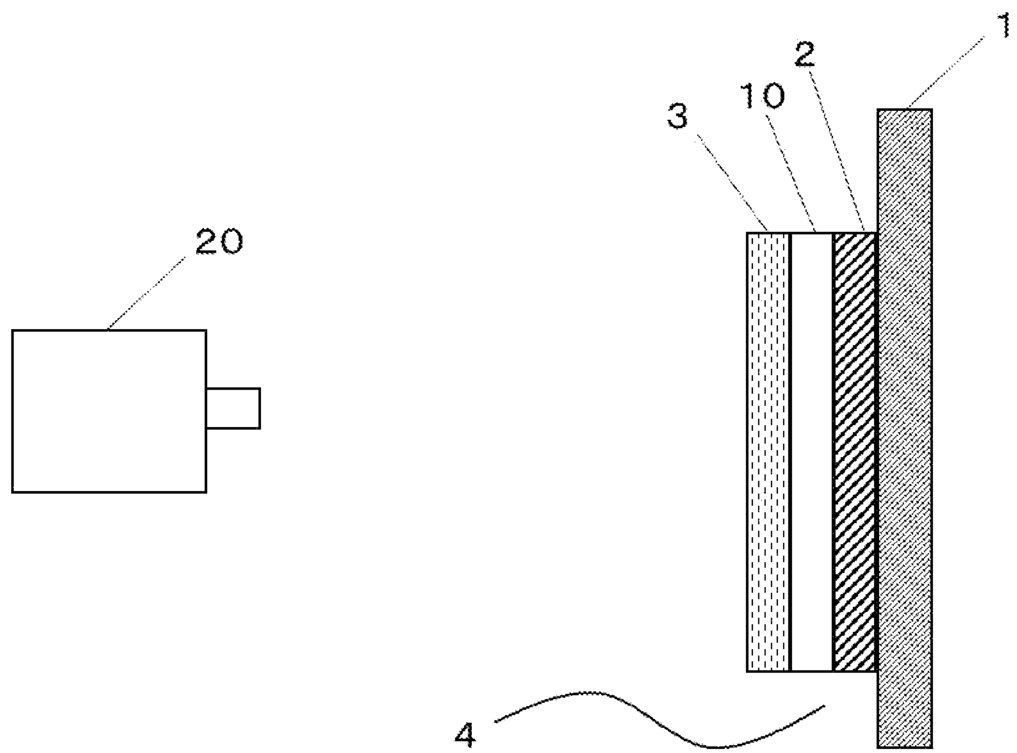
FIG. 1 is a schematic diagram showing a measurement form when calculating a "luminance difference variation 3σ".

Hereinafter, the embodiments of the present disclosure will be described.

[Optical Biaxially Stretched Plastic Film]

The optical biaxially stretched plastic film of the present disclosure has a region satisfying the following condition 1 and condition 2 (which may be hereinafter referred to as "measurement region").

<Measurement Conditions

<Condition 1>

The "luminance difference variation 3σ" in the condition 1 is determined using L1.n obtained in measurement 1 and L2.n obtained in measurement 2 below. In this description, 3σ refers to 3σ used in statistics. The 3σ in statistics means that the measurement data are present in the area of +3σ with a probability of 99.7% with respect to 100% of the region of the normal distribution curve obtained from the histogram. That is, it means that there are 100 or more areas of +3σ in the histogram of the luminance difference at 100 measurement points in the condition 1. Further, in this description, the "luminance" means light energy to be detected by the measurement procedure, which will be described below, and is a dimensionless value.

<<Measurement 1>>

The method for measuring L1.n that is the luminance at the n-th measurement point will be described with reference to FIGS. 1, 3, and 4.

As shown in FIG. 1, an optical biaxially stretched plastic film (10) of the present invention is laminated in the order of a surface light source (1), a first polarizer (2), the optical biaxially stretched plastic film (10), and a second polarizer (3). This is used as a measurement sample 1 (4).

The measurement sample 1 is disposed so that the slow axis direction of the optical biaxially stretched plastic film is substantially perpendicular to the absorption axis direction of the first polarizer, and the absorption axis of the second polarizer is substantially perpendicular to the absorption axis direction of the first polarizer. In this description, to be substantially perpendicular means to be within 90 degrees±5 degrees, unless otherwise specified, preferably within 90 degrees±3 degrees, more preferably within 90 degrees±1 degree.

Then, an imaging luminance meter 20 is installed at a place 750 mm away from the surface of the surface light source. The second polarizer may be disposed just in front of the imaging luminance meter 20. That is, the optical biaxially stretched plastic film may not be in contact with the second polarizer.

Figure 3:
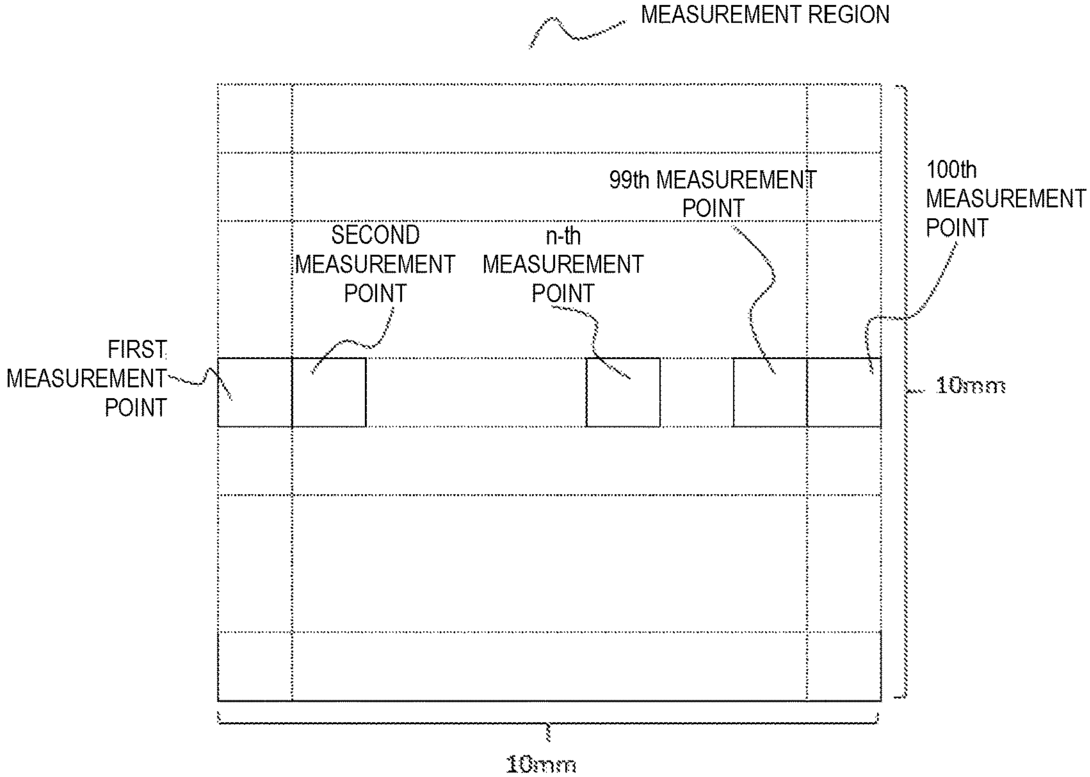
FIG. 3 is a schematic diagram showing an example of the measurement region when calculating the "luminance difference variation 3σ".
Figure 4:
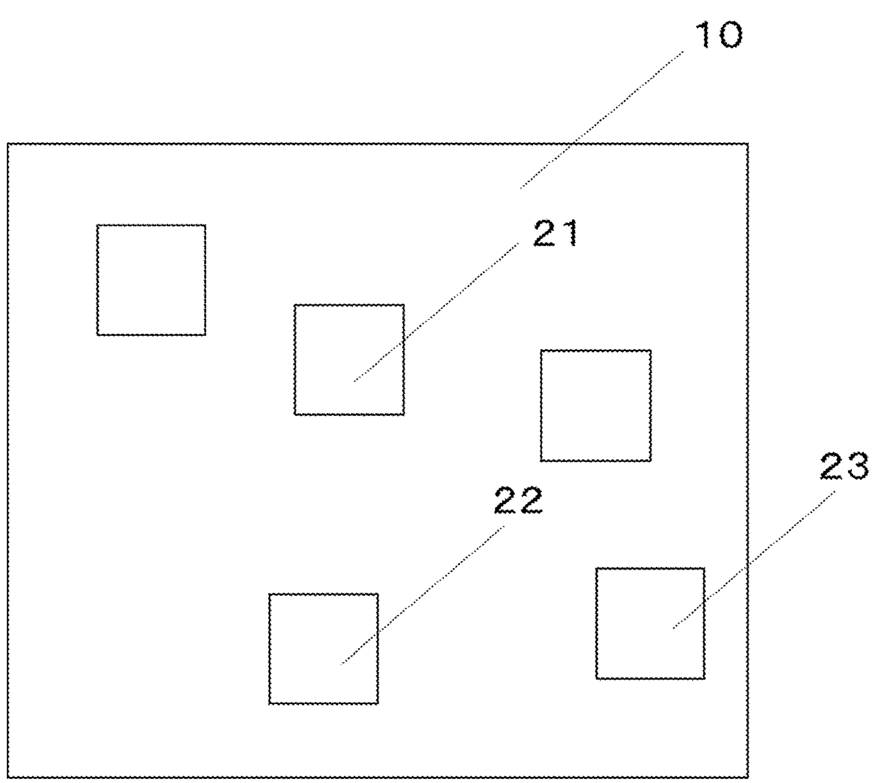
FIG. 4 is a schematic diagram showing an example of the measurement region.

Then, any region on the second polarizer is set as a measurement region in the measurement 1, and a total of 10,000 measurement points, 100×100 in the vertical and horizontal directions, are uniformly set in the measurement region, as shown in FIG. 3. The measurement region in the measurement 1 is referred to as a "first measurement region". The region is preferably 100 mm×100 mm, but in the case where a small display element such as a mobile device, a narrower region may be set. Any one column is selected from the horizontal 100 columns, the leftmost cell is defined as the first measurement point, and the rightmost cell is defined as the 100th measurement point, so that the measurement points from the first to the 100th are defined. The luminance at each measurement point is measured by the imaging luminance meter. The luminance at the first measurement point is defined as L1.1, the luminance at the 100th measurement point is defined as L1.100, and the luminance at the n-th measurement point in the measurement sample 1 is defined as L1.n.

As shown in FIG. 3, the vertical and horizontal directions of the measurement points 100 in vertical×100 in horizontal in the measurement 1 conform to the vertical and horizontal directions of the measurement sample 1. Likewise, the vertical and horizontal directions of the measurement points of 100 in vertical×100 in horizontal in the measurement 2 also conform to the vertical and horizontal directions of the measurement sample 2. When the shape in plan view of the measurement sample 1 and the measurement sample 2 is rectangular or square, it is easy to certify the horizontal or vertical direction. It is not necessary to distinguish between the horizontal and vertical directions.

When the shape in plan view of the measurement sample 1 and the measurement sample 2 is a shape other than the rectangular or square shape (such as circles and triangles), a rectangle or square having the maximum area that does not protrude from the outer frame of these samples is drawn, and the horizontal or vertical direction may be certified based on the rectangular or square drawn.

The luminance is measured in a dark room.

The first polarizer is preferably disposed so that the absorption axis of the first polarizer is substantially parallel to the horizontal or vertical direction of the surface light source. In this description, to be substantially parallel means that the difference between the absorption axis of the polarizer and the horizontal or vertical direction of the surface light source is within ±5 degrees, preferably within ±3 degrees, further preferably within ±1 degree.

The determination of the horizontal and vertical directions of the surface light source is based on the determination of the horizontal and vertical directions of the measurement sample 1 and the measurement sample 2. The reason for the disposition such that the angle formed by the absorption axis direction of the first polarizer and the horizontal or vertical direction of the surface light source is substantially parallel to each other is in consideration of the fact that the polarizer on the light emitting surface side of a general purpose image display device is disposed as such.

In the measurement 1, measurement points having a luminance variation of over 30% with the adjacent measurement point are excluded from the measurement results since they are based on local defects of the member constituting the measurement sample 1. If there is such an abnormal point, the 3σ in the condition 1 is calculated based on points other than the abnormal point. The same applies to the measurement 2, which will be described below. For example, in the case of the first measurement point in FIG. 3, the second measurement point is the adjacent measurement point, and in the case of the 5th measurement point, the 4th and 6th measurement points are adjacent measurement points.

The number of luminance measurement points used in calculating the "luminance difference variation 3σ" is preferably 10 or more, more preferably 20 or more, more preferably 30 or more, more preferably 40 or more, more preferably 50 or more, more preferably 70 or more, more preferably 90 or more. When the number of luminance values used for calculation is small, it does not reflect the properties of the measurement sample 1, which is not preferable.

The number of measurement points described above is preferable particularly in a small display device.

Meanwhile, in the case of a large display device of 20 inches or more (further, 50 inches or more), the number of measurement points is preferably 80 or more, more preferably 90 or more, in order to measure the variation well.

The upper limit of the number of luminance measurement points is 100. The number of luminance measurement points is most preferably 100 but is preferably 80 or more, in order to reflect the properties of the measurement sample 1 well.

The optical biaxially stretched plastic film may be, for example, in the form of a sheet (see FIG. 4) or in the form of a roll. In the measurement according to the condition 1, the optical biaxially stretched plastic film in the form of a sheet or a roll may be used as it is, but it may be cut out into a size of 100 mm or more in vertical×100 mm or more in horizontal (hereinafter, referred to as a measurement sample), and a region of 100 mm in vertical×100 mm in horizontal inside from the contour by 1 mm or more in the vertical and horizontal directions may be used as a measurement region, for ease of handleability or in the case where the optical biaxially stretched plastic film is too large to set in the measuring device. The reason why the inner region of the sample is measured is in consideration of the fact that stress is likely to be applied in the vicinity of the edge of the plastic film when the sample is cut, and thus the optical axis in the vicinity of the edge of the sample may be distorted. In FIG. 4, an example in which the first to third samples (21, 22, and 23) are cut out from an optical biaxially stretched plastic film 10 in the form of a sheet is shown.

In the case of using after cutting, it may be cut out from any place of the optical biaxially stretched plastic film, but if the vertical and horizontal directions of the sheet and the roll can be confirmed, the sample is cut out along the vertical and horizontal directions confirmed. For example, in the case of a roll, the flow direction (MD direction) of the roll can be regarded as the vertical direction, and the width direction (TD direction) of the roll can be regarded as the horizontal direction. Further, in the case where the flow direction and the width direction of a sheet can be confirmed, the flow direction can be regarded as the vertical direction, and the width direction can be regarded as the horizontal direction. In the case where it is difficult to confirm the flow direction and the width direction of a sheet, and the sheet is rectangular or square, the vertical and horizontal directions may be confirmed by the four sides constituting the rectangle or square. In the case where it is difficult to confirm the flow and width directions of the sheet, and the sheet has a shape other than the rectangular or square shape (such as circles and triangles), a rectangle or square having the maximum area that does not protrude from the outer frame of the sheet is drawn, and the horizontal and vertical directions may be confirmed based on the sides of the rectangular or square drawn. Further, in the case of an optical biaxially stretched plastic film in the form of a sheet, it is preferable to cut out the sample from the vicinity of the center, and in the case of an optical biaxially stretched plastic film in the form of a roll, it is preferable to cut out the sample from the vicinity of the center in the width direction of the roll.

The aforementioned embodiment of sampling in the condition 1 can be applied to the embodiment of sampling in the later-described condition 2 (however, the size of the sample in the condition 2 is 100 mm×100 mm).

In the case where an optical biaxially stretched plastic film is incorporated into a commercially available image display device, the image display device is disassembled, the optical biaxially stretched plastic film is taken out by peeling or the like from the laminate disposed on the display element, and the optical biaxially stretched plastic film taken out can be evaluated for whether or not the conditions 1 and 2 are satisfied.

In the measurement 1 and the measurement 2, the luminance is measured, as follows. As described above, the luminance in the measurement 1 and the measurement 2 means light energy to be detected by the following measurement procedure and is a dimensionless value.

The atmosphere in the measurement 1 and the measurement 2 is a temperature of 23° C.±5° C. and a relative humidity of 40% RH or more and 65% RH or less. Further, before conducting the measurement 1 and the measurement 2, the measurement sample 1 and the measurement sample 2 are left standing in the atmosphere for 30 minutes or more.

<<Measurement Procedure of Measurement 1>>

The surface light source of the measurement sample 1 is displayed in white.

The measuring device used is product number "Prometric PM1423-1, imaging luminance meter, CCD resolution: 1536×1024" of Cybernet Systems CO., LTD. (currently, Radiant Vision Systems, LLC). The measurement sample 1 and the imaging luminance meter are set in the positional relationship shown in FIG. 1. The distance between the camera and the surface light source is set to 750 mm.

Then, the following "setting before measurement" and "adjustment of exposure time" are performed, and the following "measurement and analysis" is then performed. The measurement is performed in a dark room environment.

<Setting Before Measurement>

(1) Connect the imaging luminance meter to a personal computer, and start a software (RADIANT IMAGING Prometric 9.1 Version9.1.32) attached to the imaging luminance meter in the personal computer.

(2) When the software is started, the CCD temperature in the imaging luminance meter is automatically adjusted to blue display (−10° C.). Wait until the CCD temperature stabilizes at −10° C.

(3) Specify "Color, 1×1 binning" in the "Measurement setup" of the software.

(4) Set the dial of the lens aperture to 1.8, and focus on the second polarizer.

<Adjustment of Exposure Time>

"Adjustment of exposure time" in the software is carried out. Specifically, press "Adjust" Y (green), X (red), and Z (blue) in this order, and then save the settings. The exposure time is adjust every time the sample is measured.

<Measurement and Analysis>

Select "Focus mode" on the toolbar, and check the measurement target region is reflected in the image in focus mode.

Press "Measurement execution" to carry out the measurement. Save the measurement results.

Select "Tools" and "Measurement data processing" on the toolbar. Then, select "Cut range" from the pull-down menu of "Select processing content". Then, specify the range corresponding to 100 mm×100 mm of the sample and save it. The data saved above is named "saved data 1". (In the case of a small display element such as a mobile device, a narrower region than 100 mm×100 mm may be specified. For example, in the case of a small display element, a range such as 30 mm×100 mm, 30 mm×70 mm, 30 mm×50 mm, and 30 mm×30 mm may be specified. Further, in the case of a small display element, the range may be specified by the size and shape corresponding to the shape of the element.)

The saved data 1 is opened. Then, select "Tools" and "Export measurement data" on the toolbar. Then, select "Luminance" as the data type, set the resolution to "X:100, Y:100", set the output format to "XY Table", and export the Excel data.

The luminance data at measurement points of 100×100 in the vertical and horizontal directions can be obtained by the aforementioned procedure. The luminance data (L1.n: luminance in the measurement 1) at 100 points shown in FIG. 3 can be obtained by extracting 100 points in any horizontal row from the measurement results.

<<Measurement Procedure in Measurement 2>>

The measurement procedure in the measurement 2 is explained by replacing the "measurement sample 1" and the "L1.n: luminance in the measurement 1" in the measurement procedure in the measurement 1 with the "measurement sample 2" and the "L2.n: luminance in the measurement 2".

<<Measurement 2>>

Figure 2:
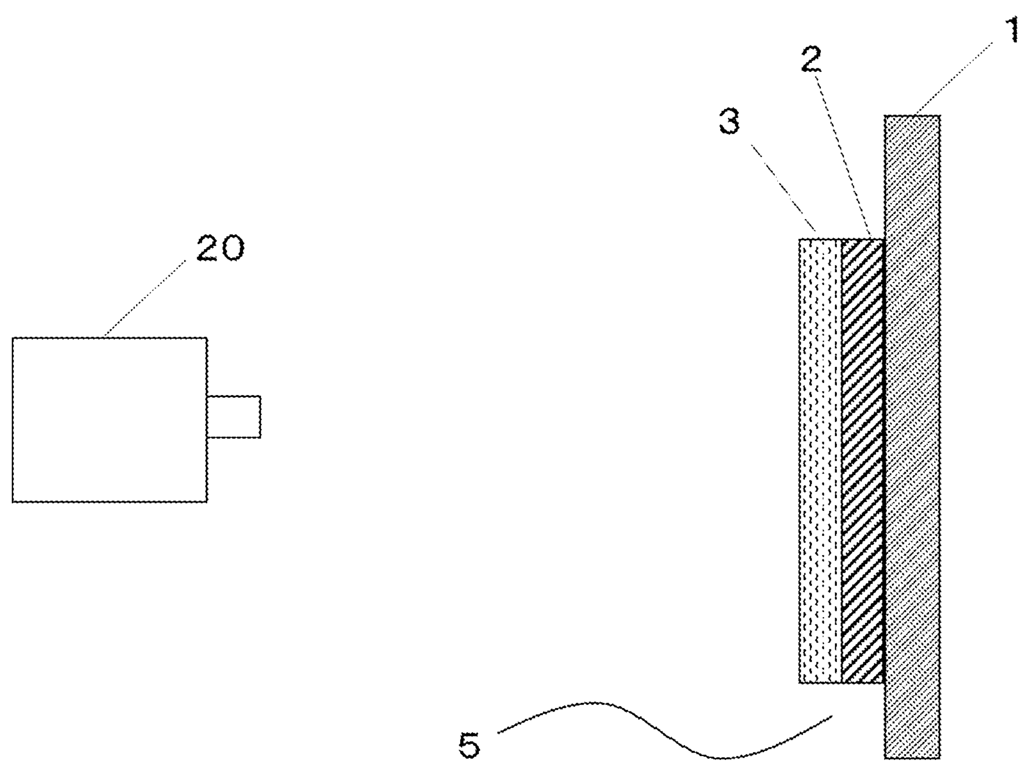
FIG. 2 is a schematic diagram showing a measurement form when calculating the "luminance difference variation 3σ".

The method for measuring the luminance L2.n at the n-th measurement point will be described with reference to FIGS. 2, 3, and 4.

Using the measurement sample 2 obtained by removing the optical biaxially stretched plastic film from the measurement sample 1 in the measurement 1, the luminance is measured in the same manner except that the optical biaxially stretched plastic film is removed. The second measurement region that is the measurement region in the measurement 2 substantially coincides with the first measurement region that is the measurement region in the measurement 1. To substantially coincide in this description means that the deviation of the measurement regions is within 0.5 mm, preferably within 0.3 mm, more preferably within 0.1 mm.

In the same manner as described with reference to FIG. 3 in the measurement 1, 100 measurement points are set, and the luminance is measured at each point. The first measurement point in the measurement sample 2 substantially coincides with the first measurement point in the measurement sample 1 with a luminance referred to as L2.1, the 100th measurement point in the measurement sample 2 substantially coincides with the 100th measurement point in the measurement sample 1 with a luminance referred to as L2.100, and the luminance at the n-th measurement point in the measurement sample 2 is referred to as L2.n.

The horizontal row relating to L2.n in the measurement 2 coincides with any horizontal row relating to L1.n in the measurement 1. For example, in the case where the horizontal row relating to L1.n in the measurement 1 is the 50th horizontal row, the horizontal row relating to L2.n in the measurement 2 is also the 50th horizontal row.

The difference between the luminance at the first measurement point obtained in the measurement 1 and the luminance at the first measurement point obtained in the measurement 2 is calculated. In the same manner, the luminance difference is calculated for each of the 100 points up to the 100th measurement point, and the "luminance difference variation 3σ" is calculated from the luminance differences obtained for the 100 points.

For confirmation, the surface light source (1), the first polarizer (2), and the second polarizer (3) are stacked in this order in the measurement 2. At that time, disposition is such that the absorption axis direction of the second polarizer is substantially perpendicular to the absorption axis direction of the first polarizer.

The values of the upper limit and the lower limit described in the subject application can be appropriately combined, to represent a range with such values serving as the maximum value and the minimum value.

In the condition 1, the "luminance difference variation 3σ" is stipulated to be 100 or more.

Since L1.n and L2.n are values including the properties of the backlight, environmental factors, and the like, the luminance difference between L1.n and L2.n (L1.n−L2.n) is used to calculate "luminance difference variation 3σ" in the condition 1 of the present disclosure.

When the "luminance difference variation 3σ" is 100 or more, no blackout occurs, or its influence is weak, and it is possible to read information from a smartphone or the like using an optical biaxially stretched plastic film while wearing polarized sunglasses or polarized goggles. Therefore, the lower limit of the "luminance difference variation 3σ" needs to be 100 or more, preferably 105 or more, more preferably 110 or more. Meanwhile, when the "luminance difference variation 3σ" is excessively large, defects such as a decrease in mechanical strength are likely to occur, and wrinkles in the optical biaxially stretched plastic film due to humidity or the like and rainbow unevenness due to distortion may occur. Therefore, the upper limit is preferably 800 or less, more preferably 600 or less, more preferably 500 or less, more preferably 450 or less.

The condition 1 can be easily satisfied by satisfying the conditions 3 and 4 described later.

Examples of the preferable range of the luminance difference variation 36 in the condition 1 include 100 or more and 800 or less, 100 or more and 600 or less, 100 or more and 500 or less, 100 or more and 450 or less, 105 or more and 800 or less, 105 or more and 600 or less, 105 or more and 500 or less, 105 or more and 450 or less, 110 or more and 800 or less, 110 or more and 600 or less, 110 or more and 500 or less, and 110 or more and 450 or less.

The luminance difference variation 36 in the condition 1 is calculated from any horizontal row out of the 100 rows. In this embodiment, 50 or more rows preferably satisfy the condition 1 in the 100 rows, more preferably 70 or more rows, more preferably 90 or more rows, more preferably 95 or more rows, more preferably 100 rows.

The lower limit of L1.n used for calculating the "luminance difference variation 3σ" is preferably 80 or more, more preferably 100 or more. Further, the upper limit of the L1.n is preferably 1200 or less, more preferably 1,000 or less, further preferably 500 or less.

Examples of the preferable range of the L1.n include 80 or more and 1200 or less, 100 or more and 1,000 or less, 80 or more and 500 or less, 100 or more and 1200 or less, 100 or more and 1,000 or less, and 100 or more and 500 or less.

Further, the lower limit of the average of the L1.n at the 100 points is preferably 150 or more, more preferably 200 or more, further preferably 250 or more, and the upper limit thereof is preferably 800 or less, more preferably 600 or less, further preferably 500 or less. The average of the L1.n at the 100 points falling within such a range can make it easy to satisfy the condition 1.

The lower limit of L2.n used for calculating the "luminance difference variation 3σ" is preferably 20 or more, more preferably 30 or more. Further, the upper limit of the L2.n is preferably 600 or less, more preferably 500 or less, further preferably 300 or less.

Examples of the preferable range of the L2.n include 20 or more and 600 or less, 30 or more and 600 or less, 20 or more and 500 or less, 30 or more and 500 or less, 20 or more and 300 or less, and 30 or more and 300 or less.

Further, the lower limit of the average of the L2.n at the 100 points is preferably 20 or more, more preferably 30 or more, and the upper limit thereof is preferably 600 or less, more preferably 500 or less, further preferably 300 or less. The average of the L2.n at the 100 points falling within such a range can make it easy to satisfy the condition 1.

The surface light source is not specifically limited, as long as it can be displayed in white. The lower limit of the color temperature when the surface light source is displayed in white is preferably 5000 K or more, more preferably 6000 K or more, further preferably 6500 K or more, and the upper limit thereof is preferably 13000 K or less, more preferably 12000 K or less, further preferably 11000 K or less. The color temperature when displayed in white falling within such a range can make it easy to homogenize the measurement results.

As the surface light source, general purpose image display devices such as liquid crystal display devices and organic EL display devices can be used, for example. However, in the case of an image display device having a polarizer on the viewer side on a display element, the image display device excluding the polarizer on the viewer side is regarded as a surface light source. This is because the polarizer on the viewer side can be the first polarizer. Further, in the case of the surface light source being a liquid crystal display device, examples of the backlight of the liquid crystal display device include a backlight using quantum dots and a backlight using white light emitting diodes.

The first polarizer is not a polarizer disposed on the display element of a commercially available image display device and is preferably separately prepared. In the case where a polarizer disposed on the display element of a commercially available image display device can be taken out in a good condition, the polarizer taken out may be used as the first polarizer.

When the first polarizer is disposed on the surface light source, the lower limit of the average of the luminance of transmitted light emitted from the first polarizer side at the 100 points in the measurement region excluding the second polarizer from the measurement 2 is preferably 15,000 or more, more preferably 17,000 or more, more preferably 18,000 or more, more preferably 20,000 or more, and the upper limit thereof is preferably 60,000 or less, more preferably 50,000 or less, more preferably 40,000 or less, more preferably 38,000 or less. Within such a range, the "luminance difference variation 3σ" can be calculated with high reproducibility.

Examples of the preferable range of the luminance of the transmitted light include 15,000 or more and 60,000 or less, 15,000 or more and 50,000 or less, 15,000 or more and 40,000 or less, 15,000 or more and 38,000 or less, 17,000 or more and 60,000 or less, 17,000 or more and 50,000 or less, 17,000 or more and 40,000 or less, 17,000 or more and 38,000 or less, 18,000 or more and 60,000 or less, 18,000 or more and 50,000 or less, 18,000 or more and 40,000 or less, 18,000 or more and 38,000 or less, 20,000 or more and 60,000 or less, 20,000 or more and 50,000 or less, 20,000 or more and 40,000 or less, and 20,000 or more and 38,000 or less.

The lower limit of the 3σ, when the first polarizer is disposed on the surface light source, in the luminance of the transmitted light emitted from the first polarizer side as a value calculated from the 100 points in the measurement region excluding the second polarizer from the measurement 2 is preferably 1,000 or more, more preferably 1300 or more, more preferably 1500 or more, and the upper limit thereof is more preferably 10,000 or less, more preferably 8,000 or less, more preferably 70,000 or less. As mentioned above, the influence of the surface light source or the like is eliminated by using a difference as the "luminance difference variation 3σ". Further the 3σ in the luminance of the transmitted light falling within such a range can make it possible to calculate the "luminance difference variation 3σ" with high reproducibility.

Examples of the preferable range of the 3σ in the luminance of the transmitted light include 1,000 or more and 10,000 or less, 1,000 or more and 8,000 or less, 1,000 or more and 70,000 or less, 1,300 or more and 10,000 or less, 1,300 or more and 8,000 or less, 1,300 or more and 70,000 or less, 1,500 or more and 10,000 or less, 15,000 or more and 8,000 or less, and 1,500 or more and 70,000 or less.

Further, the surface light source preferably satisfies the following condition A, for facilitating suppression of rainbow unevenness. Satisfying the condition A means at least any of the full width at half maximum of the intensity peak present in each of the blue wavelength region, the green wavelength region, and the red wavelength region is a predetermined value or more (10 nm or more).

Figure 9:
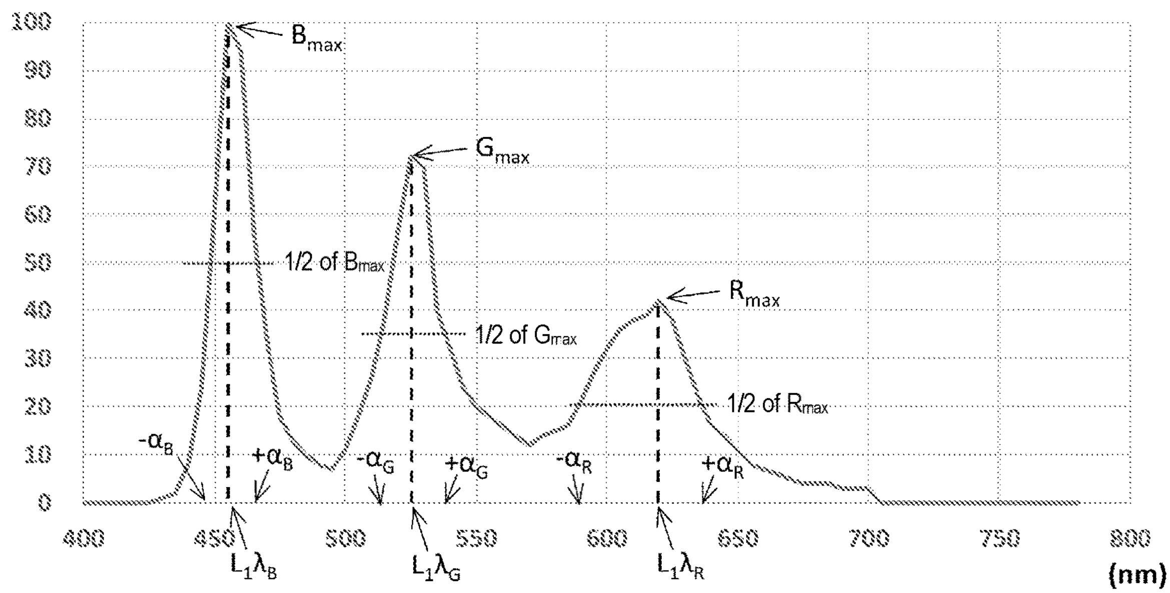
FIG. 9 is a graph for explaining $[+\alpha_B-(-\alpha_B)]$, $[+\alpha_G-(-\alpha_G)]$, and $[+\alpha_R-(-\alpha_R)]$ of the condition A.

FIG. 9 is a graph for describing [$+\alpha_B-(-\alpha_B)$], [$+\alpha_G-(-\alpha_G)$], and [$+\alpha_R-(-\alpha_R)$] of the condition A. The spectral spectrum of FIG. 9 is a spectral spectrum of a surface light source of a general purpose organic EL device.

<Condition A>

A first polarizer is disposed on a surface light source, and the intensity of light $L_1$ emitted from the first polarizer side in the perpendicular direction is measured at 1 nm interval of wavelength. The blue wavelength region is set to 400 nm or more and less than 500 nm, the green wavelength region is set to 500 nm or more and less than 570 nm, and the red wavelength region is set to 570 nm or more and 780 nm or less. The maximum intensity of the blue wavelength region of the L1 is referred to as $B_{max}$, the maximum intensity of the green wavelength region of the $L_1$ is referred to as $G_{max}$, and the maximum intensity of the red wavelength region of the L1 is referred to as $R_{max}$.

The wavelength that represents $B_{max}$ is referred to as $L_1\lambda_B$, the wavelength that represents $G_{max}$ is referred to as $L_1\lambda_G$, and the wavelength that represents $R_{max}$ is referred to as $L_1\lambda_R$.

The wavelength that represents the intensity of ½ or less of $B_{max}$ and that is the minimum wavelength located on the minus side of $L_1\lambda_B$ is referred to as $-\alpha_B$, the wavelength that represents the intensity of ½ or less of $B_{max}$ and that is the minimum wavelength located on the plus side of $L_1\lambda_B$ is referred to as $+\alpha_B$, the wavelength that represents the intensity of ½ or less of $G_{max}$ and that is the maximum wavelength located on the minus side of $L_1\lambda_G$ is referred to as $-\alpha_G$, the wavelength that represents the intensity of ½ or less of $G_{max}$ and that is the minimum wavelength located on the plus side of $L_1\lambda_G$ is referred to as $+\alpha_G$, the wavelength that represents the intensity of ½ or less of $R_{max}$ and that is the maximum wavelength located on the minus side of $L_1\lambda_R$, is referred to as $-\alpha_R$, and the wavelength that represents the intensity of ½ or less of $R_{max}$ and that is the maximum wavelength located on the plus side of $L_1\lambda R$ is referred to as $+\alpha_R$.

At least any of $[+\alpha_B-(-\alpha_B)]$, $[+\alpha_G-(-\alpha_G)]$, and $[+\alpha_R-(-\alpha_R)]$ is 10 nm or more.

In the condition A, two or more of $[+\alpha_B-(-\alpha_B)]$, $[+\alpha_G-(-\alpha_G)]$, and $[+\alpha_R-(-\alpha_R)]$ more preferably represent 10 nm or more, and three all further preferably represent 10 nm or more.

The $[+\alpha_B-(-\alpha_B)]$ is more preferably 15 nm or more, further preferably 17 nm or more. The $[+\alpha_B-(-\alpha_B)]$ is preferably 70 nm or less, more preferably 50 nm or less, further preferably 30 nm or less.

The $[+\alpha_G-(-\alpha_G)]$ is more preferably 15 nm or more, further preferably 20 nm or more. The $[+\alpha_G-(-\alpha_G)]$ is preferably 70 nm or less, more preferably 50 nm or less, further preferably 45 nm or less.

The $[+\alpha_R-(-\alpha_R)]$ is more preferably 15 nm or more, further preferably 20 nm or more, further preferably 30 nm or more. The $[+\alpha_R-(-\alpha_R)]$ is preferably 70 nm or less, more preferably 65 nm or less, further preferably 60 nm or less.

<Condition 2>

Figure 5:
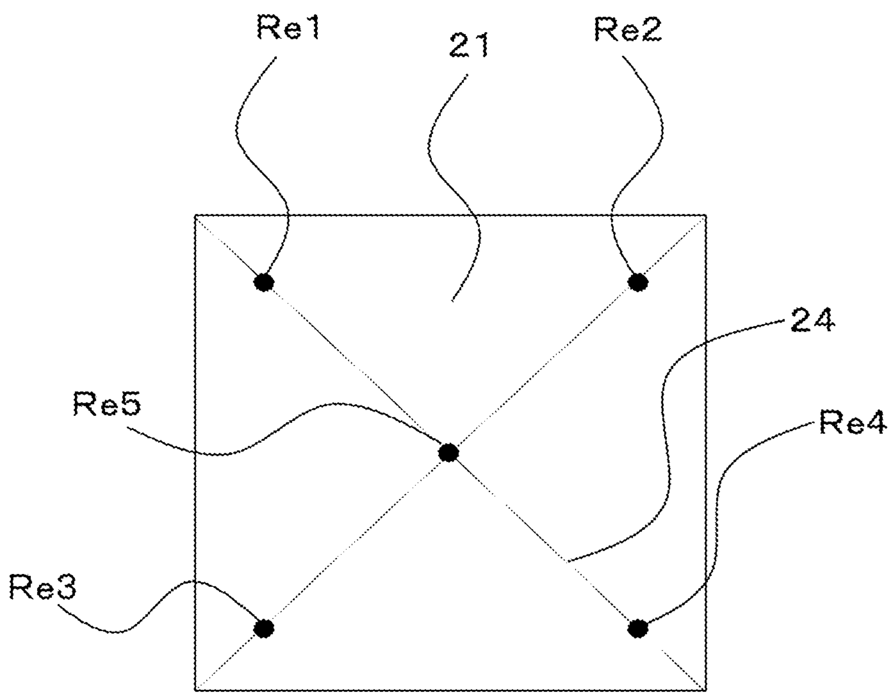
FIG. 5 is a plan view for explaining five measurement points in the conditions 2 to 4.

For the in-plane phase difference (Re), in-plane phase differences are measured at a total of five points including four points 10 mm advanced from the four corners of each sample of 100 mm in vertical×100 mm in horizontal toward the center and the center of the sample (black dots in FIG. 5). When the in-plane phase differences at the five points are respectively defined as Re1, Re2, Re3, Re4, and Re5, the average of Re1 to Re5 is 2500 nm or less. The in-plane phase differences is calculated from the refractive index nx in the slow axis direction that is the direction in which the refractive index is largest at each point, the refractive index ny in the fast axis direction that is the direction orthogonal to the slow axis direction, and the thickness T [nm] of the biaxially stretched plastic film by the following formula (1). The average of the in-plane phase differences is calculated from each value of the in-plane phase difference. In this description, the in-plane phase difference and the phase difference in the thickness direction mean values at a wavelength of 550 nm. Further, in the case where the slow axis directions are not uniform in the plane of the biaxially stretched plastic film, the slow axis direction of the biaxially stretched plastic film means the average of the slow axis directions in the plane of the biaxially stretched plastic film.

$$\text{In-plane phase difference (Re)}=(nx-ny)\times T[\text{nm}] \quad (1)$$

The slow axis direction and the in-plane phase difference can be measured, for example, by product name "RETS-100" of Otsuka Electronics Co., Ltd.

In the case of measuring the in-plane phase difference (Re) or the like using product name "RETS-100" of Otsuka Electronics Co., Ltd., the measurement is preferably prepared according to the following procedures (A1) to (A4).

(A1) First, the light source is turned on and left standing for 60 minutes or more, in order to stabilize the light source of RETS-100. Thereafter, the rotating-analyzer method is selected, and the θ mode (mode for measuring the angular phase difference and calculating the Rth) is selected. The selection of this θ mode allows the stage to be an inclined rotation stage.

(A2) Then, the following measurement conditions are input into RETS-100.

(Measurement conditions)

Retardation measurement range: rotating-analyzer method

Measurement spot diameter: φ5 mm

Inclination angle range: 0°

Measurement wavelength range: 400 nm or more and 800 nm or less

Average refractive index of biaxially stretched plastic film

For example, in the case of a PET film, N=1.617. The average refractive index N of the plastic film can be calculated by the formula (N=(nx+ny+nz)/3) based on nx, ny, and nz.

Thickness: thickness separately measured by SEM or optical microscope (A3) Then, background data is obtained without installing a sample in this device. A closed system is employed as the device, and the same procedure is performed every time the light source is turned on.

(A4) Thereafter, a sample is installed on the stage in the device and measured.

In the condition 2, the value of the Re of the optical biaxially stretched plastic film is stipulated to be 2500 nm or less.

Since it is biaxially stretched, the optical biaxially stretched plastic film of the present disclosure has good mechanical strength.

Further, since the Re of the optical biaxially stretched plastic film of the present disclosure is 2500 nm or less, the stretching ratios in the vertical and horizontal directions are in suitable ranges, so that the mechanical strength can be improved more, and the tear resistance can be improved. Further, since the Re of the optical biaxially stretched plastic film of the present disclosure is 2500 nm or less, it is also possible to contribute to thinning the plastic film.

Further, the optical biaxially stretched plastic film with excessively small Re may fail to achieve sufficient mechanical strength.

In order to increase the Re, the plastic film needs to be highly stretched. However, if the plastic film is highly stretched, the orientation of the polymer chains of the plastic film is aligned, resulting in problems in mechanical strength such as easy tearing in the stretching direction. Therefore, the upper limit of the Re of the optical biaxially stretched plastic film of the present disclosure is preferably 2,500 nm or less, more preferably 2,000 nm or less, more preferably 1,800 nm or less, more preferably 1,600 nm or less, more preferably 1,490 nm or less, more preferably 1,400 nm or less, more preferably 1,200 nm or less, more preferably 1,150 nm or less, more preferably 1,000 nm or less, more preferably 800 nm or less, more preferably 600 nm or less.

In the case where the thickness of the optical biaxially stretched plastic film is reduced to 10 μm or more and 50 μm or less, the Re is preferably 1,400 nm or less.

When the in-plane phase difference of the optical biaxially stretched plastic film is excessively small, the mechanical strength may be insufficient even with biaxially stretching. Therefore, the in-plane phase difference of the optical biaxially stretched plastic film is preferably 20 nm or more, more preferably 100 nm or more, further preferably 300 nm or more, even more preferably 520 nm or more.

Examples of the preferable range of the Re in the condition 2 include 20 nm or more and 2,500 nm or less, 20 nm or more and 2,000 nm or less, 20 nm or more and 1,800 nm or less, 20 nm or more and 1,600 nm or less, 20 nm or more and 1,490 nm or less, 20 nm or more and 1,400 nm or less, 20 nm or more and 1,200 nm or less, 20 nm or more and 1,150 nm or less, 20 nm or more and 1,000 nm or less, 20 nm or more and 800 nm or less, 20 nm or more and 600 nm or less, 100 nm or more and 2,500 nm or less, 100 nm or more and 2,000 nm or less, 100 nm or more and 1,800 nm or less, 100 nm or more and 1,600 nm or less, 100 nm or more and 1,490 nm or less, 100 nm or more and 1,400 nm or less, 100 nm or more and 1,200 nm or less, 100 nm or more and 1,150 nm or less, 100 nm or more and 1,000 nm or less, 100 nm or more and 800 nm or less, 100 nm or more and 600 nm or less, 300 nm or more and 2,500 nm or less, 300 nm or more and 2,000 nm or less, 300 nm or more and 1,800 nm or less, 300 nm or more and 1,600 nm or less, 300 nm or more and 1,490 nm or less, 300 nm or more and 1,400 nm or less, 300 nm or more and 1,200 nm or less, 300 nm or more and 1,150 nm or less, 300 nm or more and 1,000 nm or less, 300 nm or more and 800 nm or less, 300 nm or more and 600 nm or less, 520 nm or more and 2,500 nm or less, 520 nm or more and 2,000 nm or less, 520 nm or more and 1800 nm or less, 520 nm or more and 1,600 nm or less, 520 nm or more and 1,490 nm or less, 520 nm or more and 1,400 nm or less, 520 nm or more and 1,200 nm or less, 520 nm or more and 1,150 nm or less, 520 nm or more and 1000 nm or less, 520 nm or more and 800 nm or less, and 520 nm or more and 600 nm or less.

In the optical biaxially stretched plastic film in the form of a sheet, the proportion of the measurement region satisfying both the condition 1 and the condition 2 is preferably 50% or more, more preferably 70% or more, further preferably 90% or more, even more preferably 100%.

Further, in the case where a plurality of samples for the measurement in the conditions 1 and 2 can be collected from an optical biaxially stretched plastic film in the form of a roll, it is preferable that the samples collected from a predetermined position in the width direction of the roll fill most of the flow direction of the roll. When the aforementioned configuration is satisfied, the optical biaxially stretched plastic film can exert the effects of the present disclosure by picking up the optical biaxially stretched plastic film at the predetermined position in the width direction of the roll. That is, the optical biaxially stretched plastic film in the form of a roll does not necessarily satisfy the conditions 1 and 2 in the entire width direction and needs only to satisfy the conditions 1 and 2 at least at the predetermined position in the width direction. A plastic film in the form of a roll has various physical properties that are susceptible to changes in the width direction but has almost the same physical properties in the flow direction. Therefore, in the case where samples collected from a predetermined position in the width direction of a roll satisfy the condition 1 and condition 2, points at the same position in the width direction can be regarded as satisfying the conditions 1 and 2 in the entire flow direction of the roll.

Further, it is preferable to satisfy at least any of the following conditions 3 and 4 in the optical biaxially stretched plastic film.

<Condition 3>

The difference between the maximum value of the Re1, Re2, Re3, Re4, and Re5 obtained in the condition 2 and the minimum value of the Re1 to Re5 is preferably 5 nm or more, more preferably 30 nm or more, more preferably 50 nm or more.

Increasing the difference can make it easy to satisfy the condition 4.

Further, in order to suppress variations in optical properties and mechanical strength, the difference is preferably 100 nm or less, more preferably 70 nm or less.

<Condition 4>

When the slow axis directions at the five points in the condition 2 are measured, and the angle formed by any one side of the measurement region in the condition 2 and the slow axis direction at each measurement point is respectively defined as D1 (angle at the measurement point Re1), D2, D3, D4, and D5, the difference between the maximum value and the minimum value of D1 to D5 is preferably 5.0 degrees or more. The "any one side of the measurement region in the condition 2" means any one side of a measurement sample (100 mm×100 mm) in the condition 2. Any one side may be any one of vertical and horizontal sides of the sample, as long as all of D1 to D5 are based on the same side.

In the condition 4, the difference between the maximum value of D1 to D5 and the minimum value of D1 to D5 is stipulated to be 5.0 degrees or more. When the difference is 5.0 degrees or more, blackouts are not observed or can be reduced in the region of the sample when viewed with polarized sunglasses or polarized goggles.

Conventional optical plastic films are designed so that the slow axis directions do not shift in a narrow region, but the optical biaxially stretched plastic film satisfying the condition 4 has a different configuration from the conventional optical films in that the slow axis directions are intentionally shifted in a narrow region. The narrow region means the size of the measurement sample (100 mm×100 mm). Further, it is also possible to use an optical biaxially stretched plastic film with weakened stretching strength and the slow axis directions not sufficiently aligned. Satisfying the condition 4 makes it easier to satisfy the conditions 1 and 2. Further, satisfying the condition 4 can make it easy to improve the later-described folding resistance.

The difference between the maximum value of D1 to D5 and the minimum value of D1 to D5 is preferably 6.0 degrees or more, more preferably 8.0 degrees or more, further preferably 10.0 degrees or more.

When the difference between the maximum value of D1 to D5 and the minimum value of D1 to D5 is excessively large, the orientation of the optical biaxially stretched plastic film tends to be low, and the mechanical strength tends to decrease. Therefore, the difference is preferably 20.0 degrees or less, more preferably 17.0 degrees or less, further preferably 15.0 degrees or less.

In the condition 4, examples of the preferable range of the difference between the maximum value and the minimum value of D1 to D5 include 5.0 degrees or more and 20.0 degrees or less, 6.0 degrees or more and 20.0 degrees or less, 8.0 degrees or more and 20.0 degrees or less, 10.0 degrees or more and 20.0 degrees or less, 5.0 degrees or more and 17.0 degrees or less, 6.0 degrees or more and 17.0 degrees or less, 8.0 degrees or more and 17.0 degrees or less, 10.0 degrees or more and 17.0 degrees or less, 5.0 degrees or more and 15.0 degrees or less, 6.0 degrees or more and 15.0 degrees or less, 8.0 degrees or more and 15.0 degrees or less, and 10.0 degrees or more and 15.0 degrees or less.

D1 to D5 of the optical biaxially stretched plastic film according to one embodiment of the present disclosure are each preferably 5 degrees or more and 30 degrees or less, or 60 degrees or more and 85 degrees or less, more preferably 7 degrees or more and 25 degrees or less, or 65 degrees or more and 83 degrees or less, further preferably 10 degrees or more and 23 degrees or less, or 67 degrees or more and 80 degrees or less.

Setting each of D1 to D5 to 5 degrees or more or 85 degrees or less enables blackouts when viewed with polarized sunglasses or polarized goggles to be easily suppressed. Further, setting each of D1 to D5 to 30 degrees or less or 60 degrees or more enables the decrease of the mechanical strength due to low orientation of the optical biaxially stretched plastic film to be easily suppressed.

The optical biaxially stretched plastic film according to one embodiment of the present disclosure preferably has an in-plane phase difference to the phase difference in the thickness direction (in-plane phase difference/phase difference in the thickness direction) of 0.10 or less. In this description, the in-plane phase difference to the phase difference in the thickness direction may be expressed as "Re/Rth". The Re/Rth can be measured, for example, as follows.

The in-plane phase differences measured at five points of the sample are respectively defined as Re1, Re2, Re3, Re4, and Re5, and the phase differences in the thickness direction measured at five points of the sample are respectively defined as Rth1, Rth2, Rth3, Rth4, and Rth5.

The optical biaxially stretched plastic film preferably has an average of Re1/Rth1, Re2/Rth2, Re3/Rth3, Re4/Rth4, and Re5/Rth5 of 0.10 or less.

A small ratio of the in-plane phase difference to the phase difference in the thickness direction (Re/Rth) means that biaxial stretching of the biaxially stretched plastic film is close to uniform biaxiality. Accordingly, setting the Re/Rth to 0.10 or less can improve the mechanical strength of the biaxially stretched plastic film. The Re/Rth is more preferably 0.07 or less, further preferably 0.05 or less. The lower limit of Re/Rth is about 0.01.

The Re/Rth of a completely uniaxially stretched plastic film is 2.0. A general purpose uniaxially stretched plastic film is slightly stretched also in the flow direction. Therefore, the Re/Rth of a general purpose uniaxially stretched plastic film is about 1.0.

The Re1/Rth1, Re2/Rth2, Re3/Rth3, Re4/Rth4, and Re5/Rth5 are each preferably 0.10 or less, more preferably 0.07 or less, further preferably 0.05 or less. The lower limit of these ratios is about 0.01.

The phase difference (Rth) in the thickness direction is represented by the following formula, using the refractive index nx in the slow axis direction, which is the direction with the largest refractive index, the refractive index ny in the fast axis direction, which is a direction orthogonal to the slow axis direction, the refractive index nz in the thickness direction of the plastic film, and the thickness T of the plastic film [nm].

$$Rth=((nx+ny)/2-nz)\times T[nm]$$

The phase difference in the thickness direction (Rth) of the optical biaxially stretched plastic film is preferably 2000 nm or more, more preferably 3000 nm or more, further preferably 4000 nm or more. The upper limit of the Rth is about 10000 nm, preferably 8000 nm or less, more preferably 7000 nm or less. The Rth falling within such a range enables rainbow unevenness to be easily suppressed more.

Examples of the preferable range of the Rth of the optical biaxially stretched plastic film include 2000 nm or more and 10000 nm or less, 2000 nm or more and 8000 nm or less, 2000 nm or more and 7000 nm or less, 3000 nm or more and 10000 nm or less, 3000 nm or more and 8000 nm or less, 3000 nm or more and 7000 nm or less, 4000 nm or more and 10000 nm or less, 4000 nm or more and 8000 nm or less, and 4000 nm or more and 7000 nm or less.

In order to adjust the Rth of the optical biaxially stretched plastic film to such a range, it is preferable to increase the stretching ratios in the vertical and horizontal directions. Increasing the stretching ratios in the vertical and horizontal directions reduces the refractive index nz in the thickness direction of the biaxially stretched plastic film, thereby enabling the Rth to be easily increased.

<Details of Folding Test>

Further, satisfying the conditions 1 and 2 is preferable in that it can improve the mechanical strength of the optical biaxially stretched plastic film, such as easy tearing in the stretching direction, and the folding resistance.

Meanwhile, a plastic film not satisfying the conditions 1 and 2 may break or have folding habits strongly remaining after the folding test. Specifically, the uniaxially stretched film as disclosed in Patent Literature 1 breaks in the case of performing a folding test along the slow axis, whereas it has folding habits strongly remaining in the case of performing a folding test in a direction orthogonal to the slow axis. Further, a general purpose biaxially stretched film has folding habits strongly remaining in the case of performing a folding test in a direction orthogonal to the slow axis.

Meanwhile, the optical biaxially stretched plastic film of the present disclosure is preferable in that it can suppress folding habits remaining or breakage after the folding test, regardless of the folding direction. In order to make it easier to improve the folding resistance, the plastic film preferably satisfies the condition 4.

Figure 6:
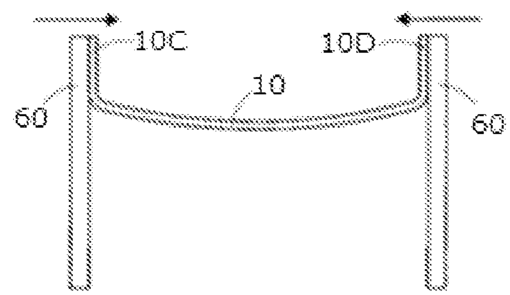
FIG. 6(A)-(C) include views schematically showing the appearance of the repeated folding test.
Figure 6:
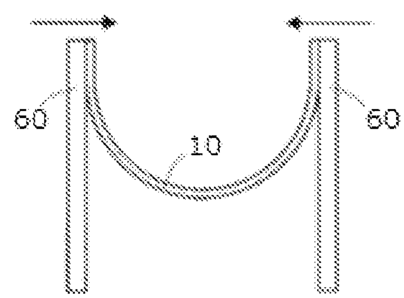
Figure 6:
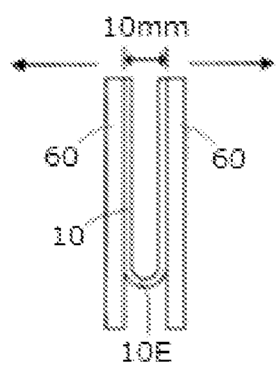

First, a side portion 10C of the optical biaxially stretched plastic film 10 and a side portion 10D facing the side portion 10C are respectively fixed to fixing portions 60 disposed parallel in the repeated folding test, as shown in FIG. 6(A). The fixing portions 60 are slidable in the horizontal direction.

Then, the fixing portions 60 are moved so as to come close to each other, so that the optical biaxially stretched plastic film 10 is deformed to be folded, as shown in FIG. 6(B). Further, the fixing portions 60 are moved to positions where the interval between the two side portions fixed with the fixing portions 60 of the optical biaxially stretched plastic film 10 and facing each other is 10 mm, and then the fixing portions 60 are moved in the reverse direction to eliminate the deformation of the optical biaxially stretched plastic film 10, as shown in FIG. 6(C).

As shown in FIGS. 6(A) to (C), the optical biaxially stretched plastic film 10 can be folded 180 degrees by moving the fixing portions 60. The interval between the two side portions of the optical film 10 facing each other could be adjusted to 10 mm by performing the repeated folding test so that a bent portion 10E of the optical biaxially stretched plastic film 10 does not protrude from the lower ends of the fixing portions 60 and controlling the interval when the fixing portions 60 are closest to each other to 10 mm.

The optical biaxially stretched plastic film preferably does not crack or break after 100,000 times of the folding test shown in Examples (more preferably after 300,000 times of the test). Further, after 100,000 times of the folding test shown in Examples (more preferably after 300,000 times of the test) when the measurement sample is placed on a horizontal table, the optical biaxially stretched plastic film preferably has an angle at which the edge of the sample rises from the table of 20 degrees or less, more preferably 15 degrees or less. The angle at which the edge of the sample rises of 15 degrees or less means that it is difficult to have a habit due to folding. Further, for both the average of the slow axis directions and the average of the fast axis directions of the optical biaxially stretched plastic film, the optical biaxially stretched plastic film preferably exhibits the aforementioned results (it does not crack or break, has no habit due to folding, and has an angle at which the edge of the sample rises after the test of 20 degrees or less).

A uniaxially stretched plastic film breaks in the stretching direction when performing the folding test and has folding habits strongly remaining in a direction orthogonal to the stretching direction.

<Optical Biaxially Stretched Plastic Film>

Examples of the laminated structure of the optical biaxially stretched plastic film include a single-layer structure and a multilayer structure. Among them, a single-layer structure is preferable.

The optical biaxially stretched plastic film needs to have a "luminance difference variation 3σ" of 100 or more and a Re of 2500 nm or less, in order to suppress blackouts when viewed with polarized sunglasses, polarized goggles or the like, and rainbow unevenness while having good mechanical strength. Then, in order to decrease the in-plane phase difference of the optical biaxially stretched plastic film, it is important to control stretching finely, such as making the stretching in the vertical and horizontal directions close to uniform. For fine stretching control, fine stretching control is difficult in a multilayer structure due to differences in physical properties of each layer, whereas fine stretching control is easy in a single-layer structure, which is preferable.

Examples of the resin component constituting the optical biaxially stretched plastic film include polyester, polyamide, polyimide, polyethersulfone, polysulfone, polypropylene, polymethylpentene, polyvinyl chloride, polyvinyl acetal, polyether ketone, polymethylmethacrylate, polycarbonate, polyurethane, and amorphous olefin (Cyclo-Olefin-Polymer: COP). Among these, polyester is preferable in that it tends to improve the mechanical strength. That is, the optical biaxially stretched plastic film is preferably a polyester film.

Examples of the polyesters constituting the polyester film include polyethylene terephthalate (PET), polyethylene naphthalate (PEN), and polybutylene terephthalate (PBT). Among these, PET is preferable for making it easy to adjust the "luminance difference variation 3σ" to 100 or more.

The optical biaxially stretched plastic film may contain additives such as ultraviolet absorbers, light stabilizers, antioxidants, antistatic agents, flame retardants, gelation inhibitors, and surfactants.

The lower limit of the thickness of the optical biaxially stretched plastic film is preferably 10 μm or more, more preferably 15 μm or more, more preferably 20 μm or more, more preferably 25 μm or more, more preferably 30 μm or more, and the upper limit thereof is preferably 200 μm or less, more preferably 180 μm or less, more preferably 150 μm or less, more preferably 100 μm or less, more preferably 80 μm or less, more preferably 60 μm or less, more preferably 50 μm or less. For thinning, the thickness of the optical biaxially stretched plastic film is preferably 50 μm or less.

The thickness of 10 μm or more enables the mechanical strength to be easily improved. Further, setting the thickness to 200 μm or less can make it easy to satisfy the condition 2.

Examples of the preferable range of the thickness of the biaxially stretched plastic film include 10 μm or more and 200 μm or less, 15 μm or more and 200 μm or less, 20 μm or more and 200 μm or less, 25 μm or more and 200 μm or less, 30 μm or more and 200 μm or less, 10 μm or more and 180 μm or less, 15 μm or more and 180 μm or less, 20 μm or more and 180 μm or less, 25 μm or more and 180 μm or less, 30 μm or more and 180 μm or less, 10 μm or more and 150 μm or less, 15 μm or more and 150 μm or less, 20 μm or more and 150 μm or less, 25 μm or more and 150 μm or less, 30 μm or more and 150 μm or less, 10 μm or more and 100 μm or less, 15 μm or more and 100 μm or less, 20 μm or more and 100 μm or less, 25 μm or more and 100 μm or less, 30 μm or more and 100 μm or less, 10 μm or more and 80 μm or less, 15 μm or more and 80 μm or less, 20 μm or more and 80 μm or less, 25 μm or more and 80 μm or less, 30 μm or more and 80 μm or less, 10 μm or more and 60 μm or less, 15 μm or more and 60 μm or less, 20 μm or more and 60 μm or less, 25 μm or more and 60 μm or less, 30 μm or more and 60 μm or less, 10 μm or more and 50 μm or less, 15 μm or more and 50 μm or less, 20 μm or more and 50 μm or less, 25 μm or more and 50 μm or less, and 30 μm or more and 50 μm or less.

The optical biaxially stretched plastic film preferably has a haze according to JIS K7136:2000 of 3.0% or less, more preferably 2.0% or less, further preferably 1.5% or less, even more preferably 1.0% or less.

Further, the optical biaxially stretched plastic film preferably has a total light transmittance according to JIS K7361-1:1997 of 80% or more, more preferably 85% or more, further preferably 90% or more.

The optical biaxially stretched plastic film is more preferably a biaxially stretched polyester film for improving the mechanical strength. Further, the optical biaxially stretched plastic film is more preferably a polyester resin layer having a single-layer structure.

The optical biaxially stretched plastic film can be obtained by stretching a resin layer containing the components constituting the plastic film. Examples of the stretching technique include sequential biaxial stretching and simultaneous biaxial stretching. Among optical biaxially stretched plastic films, biaxially stretched polyester films are preferred, biaxially stretched polyethylene terephthalate films are more preferred.

—Sequential Biaxial Stretching—

In sequential biaxial stretching, a casting film is stretched in the flow direction, and then the film is stretched in the width direction.

The stretching in the flow direction is generally performed by the difference in peripheral speed of a pair of stretching rolls. The stretching in the flow direction may be performed in one step or may be performed in multiple steps using a plurality of stretching roll pairs. In order to suppress excessive variations in optical properties such as in-plane phase difference, it is preferable to bring a plurality of nip rolls close to the stretching rolls. The stretching ratio in the flow direction is generally twice or more and 15 times or less and is preferably twice or more and 7 times or less, more preferably 3 times or more and 5 times or less, further preferably 3 times or more and 4 times or less, in order to suppress excessive variations in optical properties such as in-plane phase difference.

The stretching temperature is preferably the glass transition temperature of the resin or more and the glass transition temperature+100° C. or less, in order to suppress excessive variations in optical properties such as in-plane phase difference. In the case of PET, 70° C. or more and 120° C. or less is preferable, 80° C. or more and 110° C. or less is more preferable, and 95° C. or more and 110° C. or less is further preferable.

For the stretching temperature, the average of the in-plane phase difference tends to be small by reducing the stretching section at low temperature, for example, by rapidly raising the temperature of the film. Meanwhile, by increasing length of the stretching section of low temperature by means of such as slowly raising the temperature of the film, the orientation of the film increasing, thereby the average of the in-plane phase difference tends to be large, and the variation of the slow axis tends to be small.

It is preferable to use a heater that generates a turbulent flow during heating in stretching. A temperature difference occurs in a minute area in the plane of the film by heating with a wind containing a turbulent flow, and the temperature difference causes a minute shift in the orientation axis, thereby enabling the condition 1 and the condition 4 to be easily satisfied.

The film stretched in the flow direction may be provided with functions such as easy slipperiness, easy adhesion, and antistatic properties by in-line coating. Further, surface treatment such as corona treatment, frame treatment, and plasma treatment may be applied before in-line coating, as required.

The coating film thus formed by in-line coating is extremely thin with a thickness of 10 nm or more and 2000 nm or less (the coating film is further thinly stretched by the stretched treatment). In this description, such thin layers are not counted as the layers constituting the optical biaxially stretched plastic film.

The stretching in the width direction is generally performed with tentering by transporting the film while gripping both ends of the film with clips. The stretching ratio in the width direction is generally twice or more and 15 times or less and is preferably twice or more and 5 times or less more preferably 3 times or more and 5 times or less, further preferably 3 times or more and 4.5 times or less, in order to suppress excessive variations in optical properties such as in-plane phase difference. Further, it is preferable to set the width stretching ratio to be higher than the longitudinal stretching ratio.

The stretching temperature is preferably the glass transition temperature of the resin or more and the glass transition temperature+120° C. or less and preferably increases from the upstream to the downstream. Specifically, in the case of dividing the transverse stretching section into two, the temperature difference between the upstream and the downstream is preferably 20° C. or more, more preferably 30° C. or more, further preferably 35° C. or more, even more preferably 40° C. or more. Further, in the case of PET, the stretching temperature at the first stage is preferably 80° C. or more and 120° C. or less, more preferably 90° C. or more and 110° C. or less, further preferably 95° C. or more and 105° C. or less.

The plastic film sequentially biaxially stretched as above is preferably subjected to heating in a tenter at the stretching temperature or higher and lower than the melting point, in order to provide flatness and dimensional stability. Specifically, in the case of PET, heat setting within the range of 150° C. or more and 255° C. or less is preferably performed, more preferably 200° C. or more and 250° C. or less. Further, additional stretching of 1% or more and 10% or less is preferably performed in the first half of the heating, in order to suppress excessive variations in optical properties such as in-plane phase difference.

After heating, the plastic film is slowly cooled to room temperature and then wound up. Further, in heating and slowly cooling, relaxation treatment or the like may be used in combination, as required. The relaxation rate during heating is preferably 0.5% or more and 5% or less, more preferably 0.5% or more and 3% or less, further preferably 0.8% or more and 2.5% or less, even more preferably 1% or more and 2% or less, in order to suppress excessive variations in optical properties such as in-plane phase difference. Further, the relaxation rate during slow cooling is preferably 0.5% or more and 3% or less, more preferably 0.5% or more and 2% or less, further preferably 0.5% or more and 1.5% or less, even more preferably 0.5% or more and 1.0% or less, in order to suppress excessive variations in optical properties such as in-plane phase difference. The temperature during slow cooling is preferably 80° C. or more and 150° C. or less, more preferably 90° C. or more and 130° C. or less, further preferably 100° C. or more and 130° C. or less, even more preferably 100° C. or more and 120° C. or less, in order to improve flatness.

—Simultaneous Biaxial Stretching—

In simultaneous biaxial stretching, a casting film is guided to a simultaneous biaxial tenter and transported while gripping both ends of the film with clips, so as to be stretched simultaneously and/or stepwise in the flow and width directions. Examples of the simultaneous biaxial stretching machine include pantagraph-type, screw-type, drive motor-type, and linear motor-type. A drive motor-type or linear motor-type machine is preferable since the stretching ratio can be changed arbitrarily, and the relaxation treatment can be performed at any place.

The magnification of simultaneous biaxial stretching is generally 6 times or more and 50 times or less in terms of area magnification. The area magnification is preferably 8 times or more and 30 times or less, more preferably 9 times or more and 25 times or less, further preferably 9 times or more and 20 times or less, even more preferably 10 times or more and 15 times or less, in order to suppress excessive variations in optical properties such as in-plane phase difference. In simultaneous biaxial stretching, the stretching ratio in the flow direction and the stretching ratio in the width direction are preferably adjusted within the range of twice or more and 15 times or less, so that the aforementioned area magnification is achieved.

Further, in the case of simultaneous biaxial stretching, the stretching ratios in the flow and width directions are preferably almost the same, and the stretching speed in the flow and width directions are also preferably almost the same, in order to suppress the difference in orientation in the plane.

The stretching temperature in simultaneous biaxial stretching is preferably the glass transition temperature of the resin or more and the glass transition temperature+120° C. or less, in order to suppress excessive variations in optical properties such as in-plane phase difference. In the case of PET, the temperature is preferably 80° C. or more and 160° C. or less, more preferably 90° C. or more and 150° C. or less, further preferably 100° C. or more and 140° C. or less.

The film simultaneously biaxially stretched is preferably subjected to heating subsequently in a heat setting chamber of the tenter at the stretching temperature or higher and lower than the melting point, in order to provide flatness and dimensional stability. The heating conditions are the same as the heating conditions after sequential biaxial stretching.

<Form and Size>

The optical biaxially stretched plastic film may be in the form of a sheet cut into a predetermined size or may be in the form of a roll obtained by a long sheet into a roll. Further, the size of the sheet is not specifically limited, but the maximum diameter is about 2 inch or more and 500 inch or less, suitably 30 inch or more and 80 inch or less in the present disclosure. The "maximum diameter" refers to the maximum length when any two points in the optical film are connected. For example, in the case where the optical film is rectangular, the diagonal line of the rectangular area is the maximum diameter. Further, in the case where the optical film is circular, the diameter is the maximum diameter.

The width and the length of the roll is not specifically limited, but in general, the width is 500 mm or more and 3,000 mm or less, and the length is about 100 m or more and 5,000 m or less. The optical film in the form of a roll form can be cut into a sheet according to the size of an image display device or the like for use. When cutting, it is preferable to exclude the edge of the roll where the physical properties are not stable.

Further, the shape of the sheet is not specifically limited and may be, for example, a polygon (such as a triangle, a quadrangle, and a pentagon), a circle, or a random amorphous shape. More specifically, in the case where the optical film is quadrangular, the aspect ratio is not specifically limited, as long as there is no problem as a display screen. Examples of the ratio include horizontal:vertical=1:1, 4:3, 16:10, 16:9, and 2:1.

[Functional Film]

The optical biaxially stretched plastic film of the present disclosure may be a functional film by further forming a functional layer such as a hard coating layer, a low-refractive index layer, a high-refractive index layer, an anti-glare layer, an antifouling layer, an antistatic layer, a gas barrier layer, an antifogging layer, and a transparent conductive layer.

That is, the functional film of the present disclosure is formed by having a functional layer on the optical biaxially stretched plastic film of the present disclosure. The functional layer may be provided on at least one side of the optical biaxially stretched plastic film or may be provided on both sides thereof.

The total thickness of the functional film is preferably 100 μm or less, more preferably 60 μm or less, for suppressing excessive variations in optical properties such as in-plane phase difference and suppressing blackouts well, while maintaining the mechanical properties. Further, the balance between the thickness of the biaxially stretched plastic film and the thickness of the functional layer in the functional film is preferably 10:4 to 10:0.5.

In the functional film, the optical biaxially stretched plastic film that is the base material may satisfy the conditions 1 and 2 but preferably satisfies the following condition 1A. The preferable embodiments of the condition 1A are the same as the preferable embodiments of the condition 1 described above. Further, the measurement 1A and the measurement 2A are the same as the measurement 1 and the measurement 2 of the optical biaxially stretched plastic film of the present disclosure described above except that the biaxially stretched plastic film is changed to a functional film.

<Condition 1A>

The luminance difference between the luminance obtained in the following measurement 1A and the luminance obtained in the following measurement 2A (L1.n−L2.n) is calculated at 100 measurement points, and the "luminance difference variation 3σ" calculated from the luminance differences at the 100 measurement points is 100 or more.

<<Measurement 1A>>

A measurement sample 1A is produced by disposing a first polarizer, a functional film, and a second polarizer in this order on a surface light source. In the measurement sample 1A, the slow axis direction of the optical biaxially stretched plastic film constituting the functional film is disposed substantially perpendicular to the absorption axis direction of the first polarizer, and the absorption axis of the second polarizer is disposed substantially perpendicular to the absorption axis direction of the first polarizer.

The surface light source of the measurement sample 1A is displayed in white, the luminance of the transmitted light emitted from the second polarizer side is measured in any first region at measurement points of 100 in vertical×100 in horizonal set at equal intervals. The results at 100 points in any horizontal row are extracted from the measurement results and are sequentially referred to as the first measurement point to the 100th measurement point, and the luminance at the first measurement point is defined as L1.1, the luminance at the 100th measurement point is defined as L1.100, and the luminance at the n-th measurement point is defined as L1.n.

<<Measurement 2A>>

A measurement sample 2A is produced by disposing the first polarizer and the second polarizer in this order on a surface light source that is the same as the surface light source in the measurement 1A. In the measurement sample 2A, the absorption axis of the second polarizer is disposed substantially perpendicular to the absorption axis direction of the first polarizer.

The surface light source of the measurement sample 2A is displayed in white, and the luminance of the transmitted light emitted from the second polarizer side in a region that substantially coincides with the first measurement region measured at measurement points of 100 in vertical×100 in horizonal set at equal intervals. The results at 100 points in any horizontal row are extracted from the measurement results and are sequentially referred to as the first measurement point to the 100th measurement point, and the luminance at the first measurement point is defined as L2.1, the luminance at the 100th measurement point is defined as L2.100, and the luminance at the n-th measurement point is defined as L2.n.

<Functional Layer>

Examples of the functional layer include a hard coating layer, a low-refractive index layer, a high-refractive index layer, an anti-glare layer, an antifouling layer, an antistatic layer, a gas barrier layer, an antifogging layer, and a transparent conductive layer. The functional layer may be one selected from those described above, or may be a laminate of two or more layers of them. These functional layers are preferably optically isotropic. The "optical isotropy" refers to having an in-plane phase difference of less than 20 nm, preferably 10 nm or less, more preferably 5 nm or less.

Further, the functional layer may be a composite of two or more of the aforementioned functions. That is, in this description, the expression of each functional layer, such as a hard coating layer, a low-refractive index layer, a high-refractive index layer, an anti-glare layer, an antifouling layer, an antistatic layer, a gas barrier layer, an antifogging layer, and a transparent conductive layer not only means a functional layer having a single function but also a functional layer having a complex function. For example, the hard coating layer includes an antifouling hard coating layer, an anti-glare hard coating layer, a high-refractive index hard coating layer, and the like. Further, the antifouling layer includes an anti-glare antifouling layer, a low-refractive index antifouling layer, and the like.

Specific examples of the functional layer include (1) to (9) below. In (1) to (9) below, the left side shows a layer located on the optical biaxially stretched plastic film side. Further, in (1) to (9) below, the antifouling layer, the hard coating layer, the high-refractive index layer, the low-refractive index layer, and the anti-glare layer may complex functional belayers having other functions. For example, the low-refractive index layers of (1), (2), and (7) to (9) preferably have antifouling properties. Further, the anti-glare layer of (3) and the antifouling layer of (5) preferably have hard coating properties.

(1) A configuration of having a low-refractive index layer on a hard coating layer.
(2) A configuration of having a high-refractive index layer and a low-refractive index layer on a hard coating layer.
(3) A single-layer structure of an anti-glare layer.
(4) A configuration of having an anti-glare layer on a hard coating layer.

(5) A single-layer structure of an antifouling layer.

(6) A configuration of having an antifouling layer on a hard coating layer.

(7) A configuration of having a low-refractive index layer on an anti-glare layer.

(8) A configuration of having a low-refractive index layer on a high-refractive index hard coating layer.

(9) A configuration of having an anti-glare layer and a low-refractive index layer on a hard coating layer.

Hereinafter, a hard coating layer, a low-refractive index layer, a high-refractive index layer, an anti-glare layer, and an antifouling layer, which are typical examples of the functional layer, will be specifically described.

<Hard Coating Layer>

The hard coating layer as an example of the functional layer preferably contains a cured product of a curable resin composition such as a thermosetting resin composition or an ionizing radiation curable resin composition, more preferably contains a cured product of an ionizing radiation curable resin composition, in order to improve the scratch resistance.

The thermosetting resin composition is a composition containing at least a thermosetting resin and is a resin composition that is cured by heating. Examples of the thermosetting resin include acrylic resin, urethane resin, phenolic resin, urea melamine resin, epoxy resin, unsaturated polyester resin, and silicone resin. In the thermosetting resin composition, a curing agent is added to these curable resins, as required.

The ionizing radiation curable resin composition is a composition containing a compound having an ionizing radiation curable functional group (which may be hereinafter referred to also as "ionizing radiation curable compound"). Examples of the ionizing radiation curable functional group include ethylenically unsaturated bond groups such as a (meth)acryloyl group, a vinyl group, and an allyl group, as well as an epoxy group, and an oxetanyl group. The ionizing radiation curable compound is preferably a compound having an ethylenically unsaturated bond group, more preferably a compound having two or more ethylenically unsaturated bond groups. Among them, a (meth)acrylate compound having two or more ethylenically unsaturated bond groups is further preferable. Both monomer and oligomer (meth)acrylate compounds having two or more ethylenically unsaturated linking groups can be used.

The ionizing radiation means electromagnetic waves or charged particle beams having energy quanta that can polymerize or crosslink molecules. Ultraviolet rays (UV) or electron beams (EB) are generally used, but electromagnetic waves such as X-rays and γ-rays and charged particle beams such as α-rays and ion rays can be used, in addition.

In this description, a (meth)acrylate means an acrylate or a methacrylate, a (meth)acrylic acid means an acrylic acid or a methacrylic acid, and a (meth)acryloyl group means an acryloyl group or a methacryloyl group.

The thickness of the hard coating layer is preferably 0.1 μm or more, more preferably 0.5 μm or more, further preferably 1.0 μm or more, even more preferably 2.0 μm or more, for improve the scratch resistance. Further, the thickness of the hard coating layer is preferably 100 μm or less, more preferably 50 μm or less, more preferably 30 μm or less, more preferably 20 μm or less, more preferably 15 μm or less, more preferably 10 μm or less, for suppressing curling. The thickness of the hard coating layer is preferably 10 μm or less, more preferably 8 μm or less, in order to improve the foldability.

<Low-Refractive Index Layer>

The low-refractive index layer has roles of enhancing the anti-reflection properties of the optical film and enabling rainbow unevenness when viewed with the naked eyes to be easily suppressed. Here, the rainbow unevenness is a rainbow-like interference pattern observed due to the disturbance of the polarization state of the linearly polarized light when the linearly polarized light that has passed through a polarizer passes through a birefringent material such as a stretched plastic film.

Although the light directed toward the viewer from the inside of the image display device is linearly polarized light when it passes through the polarizer, the polarization state of the linearly polarized light is disturbed after passing through the optical biaxially stretched plastic film, to be light having P waves and S waves mixed. Then, there is a difference in reflectance between P waves and S waves, and the reflectance difference is dependent on the wavelength. Therefore, it is considered that rainbow unevenness is visible to the naked eyes. Here, in the case of having a low-refractive index layer on the optical biaxially stretched plastic film, it is considered that the aforementioned reflectance difference can be decreased, thereby enabling rainbow unevenness to be easily suppressed.

It is preferable to form the low-refractive index layer on the side farthest from the optical biaxially stretched plastic film. The anti-reflection properties can be more enhanced by forming the later-described high-refractive index layer adjacent to the low-refractive index layer on the optical biaxially stretched plastic film side of the low-refractive index layer, thereby enabling rainbow unevenness to be suppressed more easily.

The refractive index of the low-refractive index layer is preferably 1.10 or more and 1.48 or less, more preferably 1.20 or more and 1.45 or less, more preferably 1.26 or more and 1.40 or less, more preferably 1.28 or more and 1.38 or less, more preferably 1.30 or more and 1.32 or less.

Further, the thickness of the low-refractive index layer is preferably 80 nm or more and 120 nm or less, more preferably 85 nm or more and 110 nm or less, more preferably 90 nm or more and 105 nm or less. Further, the thickness of the low-refractive index layer is preferably larger than the average particle size of low-refractive index particles such as hollow particles.

The techniques for forming low-refractive index layers can be roughly classified into the wet methods and the dry methods. Examples of the wet methods include a formation technique by a sol-gel method using a metal alkoxide and the like, a formation technique by applying a resin having a low refractive index such as a fluorocarbon polymer, a formation technique by applying a coating solution for forming low-refractive index layers including a resin composition and low-refractive index particles. Examples of the dry methods include a formation technique of selecting particles having a desired refractive index out of the later-described low-refractive index particles and forming the low-refractive index layer by physical vapor deposition or chemical vapor deposition.

The wet methods are superior to the dry methods in production efficiency, suppression of diagonally reflected hue, and chemical resistance. Among the examples of the wet methods, it is preferable to form the low-refractive index layer by the coating solution for forming low-refractive index layers including a binder resin composition and low-refractive index particles, for adhesion, water resistance, scratch resistance, and low refractive index.

The low-refractive index layer is often located on the outermost surface of the optical film. Therefore, the low-refractive index layer is required to have good scratch resistance, and a general purpose low-refractive index layer is also designed to have a predetermined scratch resistance.

In recent years, hollow particles having a large particle size have been used as the low-refractive index particles, in order to decrease the refractive index of the low-refractive index layer. The inventors have found a problem that, even if the surface of a low-refractive index layer containing hollow particles having a large particle size is rubbed with those to which only fine solid matter (for example, sand) is attached or those to which only oil is attached, scratches are not visible, but if the surface is rubbed with those to which both solid matter and oil are attached, scratches are visible (resistance to this problem may be hereinafter referred to as "oil dust resistance"). The rubbing operation with those to which solid matter and oil are attached, for example, corresponds to an operation of a user operating a touch panel of an image display device with a finger to which oil contained in cosmetics, foods, or the like, and sand contained in the atmosphere are attached.

Improving the oil dust resistance of the low-refractive index layer is preferable in that it leads to the ability to maintain the effect of suppressing rainbow unevenness over a long time period.

As a result of studies, the inventors have found that the aforementioned scratches are mainly caused by chipping of some of hollow particles contained in the low-refractive index layer or dropping of the hollow particles. It is considered that this is due to large projections and recesses caused by the hollow particles formed on the surface of the low-refractive index layer. That is, when the surface of the low-refractive index layer is rubbed with a finger to which solid matter and oil are attached, the finger moves on the surface of the low-refractive index layer with the oil serving as a binder and the solid matter attached to the finger. At this time, it is considered that a phenomenon in which a part of the solid matter (for example, a pointed part of sand) enters recesses on the surface of the low-refractive index layer and a phenomenon in which the solid matter that has entered the recesses moves over the projections (hollow particles) through the recesses together with the finger tend to occur, and hollow particles are damaged or drop out due to a large force applied to the projections (hollow particles) at that time. Further, it is considered that the resin itself located in the recesses also scratched due to the friction by the solid matter, and hollow particles drop out more easily due to the damage of the resin.

The low-refractive index particles preferably contain hollow particles and non-hollow particles, in order to improve the oil dust resistance.

In order to improve the oil dust resistance, it is preferable to use hollow particles and non-hollow particles as low-refractive index particles in combination, and uniformly disperse the hollow particles and the non-hollow particles.

The materials of the hollow particles and the non-hollow particles may be any of an inorganic compound such as silica and magnesium fluoride and an organic compound but are preferably silica for low refractive index and strength. Hereinafter, hollow silica particles and non-hollow silica particles will be mainly described.

The hollow silica particles refer to particles each having an outer shell layer made of silica, with the inside of the particle surrounded by the outer shell layer being a cavity and the inside of the cavity containing air. The hollow silica particles are particles having a refractive index decreasing in proportion to the gas occupancy as compared with the original refractive index of silica by containing air. The non-hollow silica particles are particles the inside of which is not hollow like hollow silica particles. The non-hollow silica particles are, for example, solid silica particles.

The shapes of the hollow silica particles and the non-hollow silica particles are not specifically limited and may be a true sphere, a spheroid, or a substantially spherical shape such as a polyhedral shape that can be approximated to a sphere. Among these, a true sphere, a spheroid, or a substantially spherical shape is preferable, in consideration of the scratch resistance.

The hollow silica particles contain air inside and thus play a role in decreasing the refractive index of the entire low-refractive index layer. Use of hollow silica particles with an increased proportion of air and a large particle size can decrease the refractive index of the low-refractive index layer more. Meanwhile, the hollow silica particles tend to have poor mechanical strength. In particular, use of hollow silica particles with an increased proportion of air and a large particle size tends to decrease the scratch resistance of the low-refractive index layer.

The non-hollow silica particles play a role of improving the scratch resistance of the low-refractive index layer by being dispersed in the binder resin.

It is preferable to set the average particle sizes of the hollow silica particles and the non-hollow silica particles, so that the hollow silica particles are closely spaced, and further the non-hollow particles can enter between the hollow silica particles, in order to uniformly disperse the particles in the resin in the film-thickness direction while containing the hollow silica particles and the non-hollow silica particles in the binder resin at high concentration. Specifically, the ratio of the average particle size of the non-hollow silica particles to the average particle size of the hollow silica particles (average particle size of non-hollow silica particles/average particle size of hollow silica particles) is preferably 0.29 or less, more preferably 0.20 or less. Further, the ratio of the average particle size is preferably 0.05 or more.

The average particle size of the hollow silica particles is preferably 20 nm or more and 100 nm or less, in consideration of the optical properties and the mechanical strength. Since it is easy to decrease the refractive index of the entire low-refractive index layer, the average particle size of the hollow silica particles is more preferably 50 nm or more and 100 nm or less, further preferably 60 nm or more and 80 nm or less.

Further, the average particle size of the non-hollow silica particles is preferably 5 nm or more and 20 nm or less, more preferably 10 nm or more and 15 nm or less, in consideration of the dispersibility while preventing the aggregation of the non-hollow silica particles.

The surface of the hollow silica particles and the non-hollow silica particles is preferably coated with a silane coupling agent. It is more preferable to use a silane coupling agent having a (meth)acryloyl group or an epoxy group.

Applying a surface treatment to the silica particles with a silane coupling agent improves the affinity of the silica particles with the binder resin and makes it difficult for the silica particles to aggregate. Therefore, the dispersion of the silica particles tends to be uniform.

Examples of the silane coupling agent include 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene) propylamine, N-phenyl-3-aminopropyltrimethoxysilane, tris-(trimethoxysilylpropyl)isocyanurate, 3-mercaptopropylmethyldimethoxysilane, 3-mercaptopropyltrimethoxysilane, 3-isocyanatepropyltriethoxysilane, methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, 1,6-bis(trimethoxysilyl)hexane, trifluoropropyltrimethoxysilane, vinyltrimethoxysilane, and vinyltriethoxysilane. In particular, it is preferable to use one or more selected from 3-methacryloxypropylmethyldimethoxysilane, 3-methacryloxypropyltrimethoxysilane, 3-methacryloxypropylmethyldiethoxysilane, and 3-methacryloxypropyltriethoxysilane.

As the content of the hollow silica particles increases, the filling rate of the hollow silica particles in the binder resin increases, and the refractive index of the low-refractive index layer decreases. Therefore, the content of the hollow silica particles is preferably 100 parts by mass or more, more preferably 150 parts by mass or more, with respect to 100 parts by mass of the binder resin.

Meanwhile, when the content of the hollow silica particles is excessively large with respect to the binder resin, the hollow silica particles exposed from the binder resin increases, and the binder resin binding the particles decreases. Therefore, the hollow silica particles tend to be easily damaged or drop out, so that the mechanical strength such as the scratch resistance of the low-refractive index layer tend to decrease. Further, when the content of the hollow silica particles is excessively large, the transfer suitability tends to be lost. Therefore, the content of the hollow silica particles is preferably 400 parts by mass or less, more preferably 300 parts by mass or less, with respect to 100 parts by mass of the binder resin.

When the content of the non-hollow silica particles is small, the presence of the non-hollow silica particles on the surface of the low-refractive index layer may not affect the increase in hardness. Further, when the non-hollow silica particles are contained in a large amount, the influence of shrinkage unevenness due to the polymerization of the binder resin can be reduced, and projections and recesses generated on the surface of the low-refractive index layer after the resin is cured can be smaller. Therefore, the content of the non-hollow silica particles is preferably 90 parts by mass or more, more preferably 100 parts by mass or more, with respect to 100 parts by mass of the binder resin.

Meanwhile, when the content of the non-hollow silica particles is excessively large, the non-hollow silica tend to aggregate, shrinkage unevenness of the binder resin occurs, and projections and recesses on the surface become larger. Further, when the content of the non-hollow silica particles is excessively large, the transfer suitability tends to be lost. Therefore, the content of the non-hollow silica particles is preferably 200 parts by mass or less, more preferably 150 parts by mass or less, with respect to 100 parts by mass of the binder resin.

The hollow silica particles and the non-hollow silica particles contained in the binder resin at the aforementioned ratio can improve the barrier properties of the low-refractive index layer. It is inferred that this is because permeation of gas and the like is inhibited by the silica particles uniformly dispersed with high filling rate.

Further, various cosmetics such as sunscreens and hand creams may contain a polymer with low volatility and low molecular weight. The barrier properties of the low-refractive index layer is improved, thereby enabling penetration of the low-molecular weight polymer into the coating film of the low-refractive index layer to be suppressed and defects (for example, appearance abnormality) due to the low-molecular weight polymer remaining on the coating film for a long period of time to be suppressed.

The binder resin of the low-refractive index layer preferably contains a cured product of an ionizing radiation curable resin composition. Further, the ionizing radiation curable compound contained in the ionizing radiation curable resin composition is preferably a compound having an ethylenically unsaturated linking group. In particular, (meth)acrylate compounds having a (meth)acryloyl group are more preferable.

Hereinafter, (meth)acrylate compounds having four or more ethylenically unsaturated linking groups are referred to as "polyfunctional (meth)acrylate compounds". Further, (meth)acrylate compounds having two or more and three or less ethylenically unsaturated linking groups are referred to as "low-functionality (meth)acrylate compounds".

Both monomer and oligomer (meth)acrylate compounds can be used. In particular, the ionizing radiation curable compound preferably further contains a low-functionality (meth)acrylate compound, for easily suppressing shrinkage unevenness at the time of curing to facilitate smoothing the shape of projections and recesses on the surface of the low-refractive index layer.

The proportion of the low-functionality (meth)acrylate compound in the ionizing radiation curable compound is preferably 60 mass % or more, more preferably 80 mass % or more, further preferably 90 mass % or more, even more preferably 95 mass % or more, most preferably 100 mass %.

Further, the low-functionality (meth)acrylate compound is preferably a (meth)acrylate compound having two ethylenically unsaturated linking groups, for easily suppressing the shrinkage unevenness at the time of curing to facilitate smoothing the shape of projections and recesses on the surface of the low-refractive index layer.

Of (meth)acrylate compounds, examples of bifunctional (meth)acrylate compounds include polyalkylene glycol di(meth)acrylates such as di(meth)acrylate of isocyanuric acid, ethylene glycol di(meth)acrylate, polyethylene glycol diacrylate, and polybutylene glycol di(meth)acrylate, bisphenol A tetraethoxy diacrylate, bisphenol A tetrapropoxy diacrylate, and 1,6-hexanediol diacrylate.

Examples of trifunctional (meth)acrylate compounds include trimethylolpropane tri(meth)acrylate, pentaerythritol tri(meth)acrylate, and isocyanuric acid-modified tri (meth)acrylate.

Examples of polyfunctional (meth)acrylate compounds with four or more functionalities include pentaerythritol tetra(meth)acrylate, dipentaerythritol hexa(meth)acrylate, and dipentaerythritol tetra(meth)acrylate.

These (meth)acrylate compounds may be modified, as described later.

Further, examples of (meth)acrylate oligomers include acrylate polymers such as urethane(meth)acrylate, epoxy (meth)acrylate, polyester(meth)acrylate, and polyether (meth)acrylate.

The urethane(meth)acrylate can be obtained, for example, by reaction of a polyhydric alcohol, an organic diisocyanate, and hydroxy(meth)acrylate.

Further, a preferable epoxy(meth)acrylate is a (meth) acrylate obtained by reaction of (meth)acrylic acid with an aromatic epoxy resin, an alicyclic epoxy resin, an aliphatic epoxy resin or the like with three or more functionalities, a (meth)acrylate obtained by reaction of (meth)acrylic acid with an aromatic epoxy resin, an alicyclic epoxy resin, an aliphatic epoxy resin or the like with two or more functionalities and polybasic acid, and a (meth)acrylate obtained by reaction of (meth)acrylic acid with an aromatic epoxy resin, an alicyclic epoxy resin, an aliphatic epoxy resin or the like with two or more functionalities and a phenol.

Further, the (meth)acrylate compound may have a molecular skeleton partially modified, for suppressing shrinkage unevenness due to crosslinking to enhance the surface smoothness. For example, those modified with ethylene oxide, propylene oxide, caprolactone, isocyanuric acid, alkyl, cyclic alkyl, aromatic, bisphenol, or the like can be used as the (meth)acrylate compound. In particular, the (meth)acrylate compound is preferably modified with an alkylene oxide such as ethylene oxide and propylene oxide, in order to enhance the affinity with the low-refractive index particles (silica particles therein) to suppress the aggregation of the low-refractive index particles.

The proportion of the alkylene oxide-modified (meth) acrylate compound in the ionizing radiation curable compound is preferably 60 mass % or more, more preferably 80 mass % or more, further preferably 90 mass % or more, even more preferably 95 mass % or more, most preferably 100 mass %. Further, the alkylene oxide-modified (meth)acrylate compound is preferably a low-functionality (meth)acrylate compound, more preferably a (meth)acrylate compound having two ethylenically unsaturated linking groups.

Examples of the (meth)acrylate compound modified with alkylene oxide and having two ethylenically unsaturated linking groups include bisphenol F alkylene oxide-modified di(meth)acrylate, bisphenol A alkylene oxide-modified di(meth)acrylate, isocyanuric acid alkylene oxide-modified di(meth)acrylate and polyalkylene glycol di(meth)acrylate. Among them, polyalkylene glycol di(meth)acrylate is preferable. The average number of repeating units of alkylene glycol contained in the polyalkylene glycol di(meth)acrylate is preferably 3 or more and 5 or less. Further, the alkylene glycol contained in the polyalkylene glycol di(meth)acrylate is preferably ethylene glycol and/or polyethylene glycol.

Examples of a (meth)acrylate compound modified with alkylene oxide and having three ethylenically unsaturated linking groups include trimethylolpropane alkylene oxide-modified tri(meth)acrylate and isocyanuric acid alkylene oxide-modified tri(meth)acrylate.

The ionizing radiation curable resin may be used alone or in combination of two or more.

The low-refractive index layer preferably contains a leveling agent for antifouling properties and surface smoothness.

Examples of the leveling agent include fluorine and silicone leveling agents, and a silicone leveling agent is preferable. Containing a silicone leveling agent enable the low reflectance layer surface to be smoother. Further, the slipperiness and antifouling properties of the low reflectance layer surface (fingerprint wiping properties and a large contact angle with pure water and hexadecane) can be improved.

The content of the leveling agent is preferably 1 part by mass or more and 25 parts by mass or less, more preferably 2 parts by mass or more and 20 parts by mass or less, further preferably 5 parts by mass or more and 18 parts by mass or less, with respect to 100 parts by mass of the binder resin. Adjusting the content of the leveling agent to 1 part by mass or more enables various performances such as antifouling properties to be easily imparted. Further, adjusting the content of the leveling agent to 25 parts by mass or less can suppress the decrease of the scratch resistance.

The low-refractive index layer preferably has a maximum height roughness Rz of 110 nm or less, more preferably 90 nm or less, further preferably 70 nm or less, even more preferably 60 nm or less. Further, the Rz/Ra (Ra is an arithmetic average roughness) is preferably 12.0 or less, more preferably 10.0 or less. Adjusting the Rz/Ra to such a range is particularly effective in the case where the Rz is as large as about 90 nm or more and 110 nm or less.

In this description, the Ra and the Rz are three-dimensional expansions of the roughness of the two-dimensional roughness parameters described in the Upgrade Kit Operation Manual of a scanning probe microscope SPM-9600 (SPM-9600, February, 2016, P. 194-195) of SHIMADZU CORPORATION. The Ra and the Rz are defined, as follows.

(Arithmetic Average Roughness Ra)

When only the reference length (L) is extracted from the roughness curve in the direction of the average line, the X axis is taken in the direction of the average line of the extracted portion and the Y axis is taken in the direction of the vertical magnification, and the roughness curve is expressed by y=f(x), it can be determined by the following expression.

$$Ra = \frac{1}{L}\int_0^L |f(x)|dx \qquad \text{[Expression 1]}$$

(Maximum Height Roughness Rz)

It is a value obtained by extracting only the reference length from the roughness curve in the direction of the average line and measuring the interval between the ridge line and the valley line of the extracted portion in the interval of the vertical magnification of the roughness curve.

In the case of using the scanning probe microscope SPM-9600 of SHIMADZU CORPORATION, for example, the Ra and the Rz are preferably measured and analyzed under the following conditions.

<Measurement Conditions>

Measurement mode: phase
Scanning range: 5 μm×5 μm
Scanning speed: 0.8 Hz or more and 1 Hz or less
Number of pixels: 512×512
Cantilever used: product number "NCHR" of NanoWorld Holding AG
Resonance frequency: 320 kHz
Spring constant: 42 N/m <Analysis Condition>

Tilt correction: line fit

A small Rz means that the projections due to hollow silica particles in the microareas are small. Further, a small Rz/Ra means that the projections and recesses due to silica particles in the microareas are uniform, and there are no projections and recesses projecting from the average elevation difference of the projections and recesses. In the present disclosure, the numerical value of the Ra is not specifically limited, but the Ra is preferably 15 nm or less, more preferably 12 nm or less, further preferably 10 nm or less, even more preferably 6.5 nm or less.

Uniform dispersion of the low-refractive index particles in the low-refractive index layer and suppression of shrinkage unevenness in the low-refractive index layer enable the ranges of the Rz and the Rz/Ra to be easily satisfied.

Adjusting the Rz and the Rz/Ra on the surface of the low-refractive index layer to such ranges can reduce the resistance when the solid matter moves over the projections on the surface of the low-refractive index layer (due to the hollow silica particles present in the vicinity of the surface). Therefore, it is considered that the solid matter moves smoothly on the surface of the low refractive index layer even if it is rubbed with sand containing oil with a load applied. Further, it is also considered that the hardness of the recesses themselves has increased. As a result, it can be inferred that the hollow silica particles are prevented from being damaged or dropped out, and the binder resin itself is also prevented from being damaged.

The surface roughnesses such as Rz and Ra mean the average of the measured values at fourteen points excluding the minimum value and the maximum value of the measured values at sixteen points unless otherwise particularly noted.

In this description, the sixteen measurement points are preferably set by setting the area 0.5 cm from the outer edge of the measurement sample as the margin and taking sixteen points at intersections as the measurement center when lines dividing the area inside the margin into five in the vertical and horizontal directions are drawn. It is preferable to use the same measurement sample as the sample in the condition 1.

Further, the surface roughness is a value measured at a temperature of 23° C.±5° C. and a relative humidity of 40% RH or more and 65% RH or less. Further, before starting each measurement, the target sample is exposed to the aforementioned atmosphere for 30 minutes or more, and then the measurement and evaluation are performed.

The low-refractive index layer can be formed by applying and drying a coating solution for forming low-refractive index layers that is obtained by dissolving or dispersing components constituting the low-refractive index layer. In general, solvents for adjusting the viscosity or enabling the components to be dissolved or dispersed are used in the coating solution for forming the low-refractive index layer.

Examples of the solvents include ketones (such as acetone, methyl ethyl ketone, methyl isobutyl ketone, and cyclohexanone), ethers (such as dioxane and tetrahydrofuran), aliphatic hydrocarbons (such as hexane), alicyclic hydrocarbons (such as cyclohexane), aromatic hydrocarbons (such as toluene and xylene), halogenated carbons (such as dichloromethane and dichloroethane), esters (such as methyl acetate, ethyl acetate, and butyl acetate), alcohols (such as butanol and cyclohexanol), cellosolves (such as methyl cellosolve and ethyl cellosolve), cellosolve acetates, sulfoxides (such as dimethylsulfoxide), glycol ethers (such as 1-methoxy-2-propyl acetate), and amides (such as dimethylformamide and dimethylacetamide), and the mixtures of these may be used.

In the case where the solvents evaporate excessively rapidly, the solvents vigorously convect when drying the coating solution for forming low-refractive index layers. Therefore, even if the silica particles in the coating solution have been uniformly dispersed, the state of uniform dispersion easily collapses due to the vigorous convection of the solvents during drying. Therefore, the solvents preferably contain a component with slow evaporation rate. Specifically, it is preferable to contain a solvent having a relative evaporation rate (relative evaporation rate when the evaporation rate of n-butyl acetate is taken as 100) of 70 or less, more preferably 30 or more and 60 or less. Further, the proportion of the solvent having a relative evaporation rate of 70 or less is preferably 10 mass % or more and 50 mass % or less, preferably 20 mass % or more and 40 mass % or less of all solvents.

Examples of the relative evaporation rate of the solvent with slow evaporation rate include 64 of isobutyl alcohol, 47 of 1-butanol, 44 of 1-methoxy-2-propyl acetate, 38 of ethyl cellosolve, and 32 of cyclohexanone.

The residue of solvents (solvents other than solvent with slow evaporation rate) preferably have excellent ability to dissolve resins. Further, the residue of solvents preferably has a relative evaporation rate of 100 or more.

Further, the drying temperature when forming the low-refractive index layer is preferably as low as possible, in order to suppress the convection of the solvents during drying and improve the dispersibility of the silica particles. The drying temperature can be appropriately set in consideration of the types of the solvents, the dispersibility of the silica particles, the production speed, and the like.

<High-Refractive Index Layer>

The high-refractive index layer as an example of the functional layer preferably has a refractive index of 1.53 or more and 1.85 or less, more preferably 1.54 or more and 1.80 or less, more preferably 1.55 or more and 1.75 or less, more preferably 1.56 or more and 1.70 or less.

Further, the thickness of the high-refractive index layer is preferably 200 nm or less, more preferably 50 nm or more and 180 nm or less, further preferably 70 nm or more and 150 nm or less. In the case where a high-refractive index hard coating layer is provided, it preferably has a thickness equivalent to the thickness of the hard coating layer.

The high-refractive index layer can be formed, for example, from a coating solution for forming high-refractive index layers, containing a binder resin composition and high-refractive index particles. As the binder resin composition, curable resin compositions described as examples for the hard coating layer can be used, for example.

Examples of the high-refractive index particles include antimony pentoxide, zinc oxide, titanium oxide, cerium oxide, tin-doped indium oxide, antimony-doped tin oxide, yttrium oxide, and zirconium oxide. The refractive index of antimony pentoxide is about 1.79, the refractive index of zinc oxide is about 1.90, the refractive index of titanium oxide is about 2.3 or more and 2.7 or less, the refractive index of cerium oxide is about 1.95, the refractive index of tin-doped indium oxide is about 1.95 or more and 2.00 or less, the refractive index of antimony-doped tin oxide is about 1.75 or more and 1.85 or less, the refractive index of yttrium oxide is about 1.87, and the refractive index of zirconium oxide is 2.10.

The average particle size of the high-refractive index particles is preferably 2 nm or more, more preferably 5 nm or more, further preferably 10 nm or more. Further, the average particle size of the high-refractive index particles is preferably 200 nm or less, more preferably 100 nm or less, more preferably 80 nm or less, more preferably 60 nm or less, more preferably 30 nm or less, for suppressing whitening and ensuring transparency. The smaller the average particle size of the high-refractive index particles, the better the transparency. In particular, the average particle size of 60 nm or less can extremely improve the transparency.

In this description, the average particle size of the high-refractive index particles or the low-refractive index particles can be calculated by the following operations (y1) to (y3).

(y1) Capture an image of the cross section of the high-refractive index layer or the low-refractive index layer by TEM or STEM. The acceleration voltage of TEM or STEM is preferably set to 10 kv or more and 30 kV or less, the magnification is preferably set to 50,000 times or more and 300,000 times or less.

(y2) Extract any ten particles from the observation image to calculate the particle size of individual particles. The particle size is measured as a linear distance in a combination of any two parallel straight lines sandwiching each particle in cross section in which the distance between the two straight lines is maximum. In the case where the particles are aggregated, the aggregated particles are regarded as one particle and measured.

(y3) Repeat the same operation five times in an observation image on another screen of the same sample and use the value obtained from the number average of the particle sizes of fifty particles in total as the average particle size of the high-refractive index particles or the low-refractive index particles.

<Anti-Glare Layer>

The anti-glare layer as an example of the functional layer has a role of enhancing the anti-glare properties of the adherend.

The anti-glare layer can be formed, for example, from a coating solution for forming anti-glare layers, containing a binder resin composition and particles. As the binder resin composition, curable resin compositions described as examples for the hard coating layer can be used, for example.

As the particles, both organic particles and inorganic particles can be used. Examples of the organic particles include particles made of polymethylmethacrylate, polyacrylic-styrene copolymer, melamine resin, polycarbonate, polystyrene, polyvinyl chloride, benzoguanamine-melamine-formaldehyde condensate, silicone, fluororesin, and polyester resin. Examples of the inorganic particles include particles made of silica, alumina, antimony, zirconia, and titania.

The average particle size of the particles in the anti-glare layer cannot be said unconditionally since it varies depending on the thickness of the anti-glare layer but is preferably 1.0 μm or more and 10.0 μm or less, more preferably 2.0 μm or more and 8.0 μm or less, further preferably 3.0 μm or more and 6.0 μm or less.

The average particle size of the particles in the anti-glare layer can be calculated by the following operations (z1) to (z3).

(z1) Capture a transmission observation image of the cross section of the anti-glare layer with an optical microscope. The magnification is preferably set to 500 times or more and 2,000 times or less.

(z2) Extract any ten particles from the observation image to calculate the particle size of individual particles. The particle size is measured as a linear distance in a combination of any two parallel straight lines sandwiching each particle in cross section in which the distance between the two straight lines is maximum.

(z3) Repeat the same operation five times in an observation image on another screen of the same sample and use the value obtained from the number average of the particle sizes of fifty particles in total as the average particle size of the particles in the anti-glare layer.

The content of the particles in the anti-glare layer cannot be said unconditionally since it varies depending on the degree of target anti-glare properties, but is preferably 1 part by mass or more and 100 parts by mass or less, more preferably 5 parts by mass or more and 50 parts by mass or less, further preferably 10 parts by mass or more and 30 parts by mass or less, with respect to 100 parts by mass of the resin component.

The anti-glare layer may contain fine particles with an average particle size of less than 500 nm, for imparting antistatic properties, controlling the refractive index, or adjusting the shrinkage of the anti-glare layer due to curing of the curable resin composition.

The thickness of the anti-glare layer is preferably 0.5 μm or more, more preferably 1.0 μm or more, further preferably 2.0 μm or more. Further, the thickness of the anti-glare layer is preferably 50 μm or less, more preferably 30 μm or more, more preferably 20 μm or less, more preferably 15 μm or less, more preferably 10 μm or less. The thickness of the anti-glare layer is preferably 10 μm or less, more preferably 8 μm or less, in order to improve the foldability.

<Antifouling Layer>

The antifouling layer is preferably formed on the side farthest from the optical biaxially stretched plastic film.

The antifouling layer can be formed from, for example, a coating solution for forming antifouling layers, containing a binder resin composition and an antifouling agent. As the binder resin composition, curable resin compositions described as examples for the hard coating layer can be used, for example.

Examples of the antifouling agent include fluorine resins, silicone resins, and fluorine-silicone copolymer resins.

The antifouling agent preferably has a reactive group capable of reacting with the binder resin composition, in order to suppress bleeding out from the antifouling layer. In other words, the antifouling agent is preferably fixed to the binder resin composition in the antifouling layer.

Further, self-crosslinkable antifouling agents are also preferable, in order to suppress bleeding out from the antifouling layer. In other words, the antifouling agent is preferably self-crosslinked in the antifouling layer.

The content of the antifouling agent in the antifouling layer is preferably 5 mass % or more and 30 mass % or less, more preferably 7 mass % or more and 20 mass % or less, of the total solid content of the antifouling layer.

The thickness of the antifouling layer is not specifically limited. For example, in the case of an antifouling hard coating layer, it is preferable to follow the thickness of the hard coating layer. Further, in the case of an antifouling low-refractive index layer, it is preferable to follow the thickness of the low-refractive index layer.

The functional film preferably has a haze according to JIS K7136:2000 of 5% or less, more preferably 4% or less, further preferably 3% or less. Further, the functional film preferably has a haze according to JIS K7136:2000 of 0.5% or more, more preferably 1.0% or more, further preferably 1.5% or more.

Further, functional film preferably has a total light transmittance according to JIS K7361-1:1997 of 90% or more, more preferably 91% or more, further preferably 92% or more.

<Applications>

The optical biaxially stretched plastic film of the present disclosure can be suitably used as a plastic film of image display devices. As described above, the biaxially stretched plastic film of the present disclosure suppresses blackouts when viewed with polarized sunglasses, polarized goggles or the like and can be suitably used particularly for image display devices used outdoors. Further, in the case where the optical biaxially stretched plastic film satisfies the conditions 3 and 4, it can suppress folding habits remaining or breakage after the folding test, regardless of the folding direction, and therefore can be suitably used as a plastic film of curved image display devices and foldable image display devices.

Further, the optical plastic film of the present disclosure can be suitably used as a plastic film to be disposed on the light emitting surface side of image display devices. At this time, it is preferable to provide a polarizer between the light source of the image display device and the optical biaxially stretched plastic film of the present disclosure.

Examples of the plastic film of such an image display device include a plastic film used as a base material for various functional films such as a polarizer protective film, a surface protective film, an antireflection film, and a conductive film constituting a touch panel.

[Polarizing Plate]

The polarizing plate of the present disclosure is a polarizing plate having a polarizer, a first transparent protective plate disposed on one side of the polarizer, and a second transparent protective plate disposed on the other side of the polarizer, wherein at least one selecting from the group consisting of the first transparent protective plate and the second transparent protective plate is the optical biaxially stretched plastic film of the present disclosure.

The polarizing plate is used, for example, for imparting anti-reflection properties in combination with a λ/4 phase difference plate. In this case, the λ/4 phase difference plate is disposed on an image display device, and the polarizing plate is disposed on the viewer side to the λ/4 phase difference plate.

Further, in the case where the polarizing plate is for liquid crystal display devices, it is used for imparting functions of the liquid crystal shutter. In this case, a lower polarizing plate, a liquid crystal layer, and an upper polarizing plate are disposed in this order in the liquid crystal display device, so that the absorption axis of the polarizer of the lower polarizing plate and the absorption axis of the polarizer of the upper polarizing plate are orthogonal to each other. The polarizer contained in the upper polarizing plate corresponds to the first polarizer.

The polarizing plate contains the later-described polarizer.

The polarizing plate of the present disclosure uses the optical biaxially stretched plastic film of the present disclosure as at least one selecting from the group consisting of the first transparent protective plate and the second transparent protective plate. In a preferable embodiment, both the first transparent protective plate and the second transparent protective plate are the optical biaxially stretched plastic film of the present disclosure.

The first transparent protective plate and/or the second transparent protective plate in the polarizing plate of the present disclosure may have a functional layer on the optical biaxially stretched plastic film of the present disclosure. In other words, the first transparent protective plate and/or the second transparent protective plate in the polarizing plate of the present disclosure may be a functional film having a functional layer on the optical biaxially stretched plastic film of the present disclosure.

In the case where one of the first transparent protective plate and the second transparent protective plate is the optical biaxially stretched plastic film of the present disclosure, the other of the transparent protective plates is not specifically limited but is preferably an optically isotropic transparent protective plate. The "optical isotropy" refers to having an in-plane phase difference of less than 20 nm, preferably 10 nm or less, more preferably 5 nm or less. Examples of optically isotropic transparent base materials include acrylic films, cyclic olefin films, and triacetyl cellulose (TAC) films. The moisture permeability close to the biaxially stretched plastic film enables the deformation of the polarizing plate due to water absorption to be prevented and deterioration of the polarizer to be prevented. Therefore, acrylic films and cyclic olefin films are preferable.

Further, in the case where one of the first transparent protective plate and the second transparent protective plate is the optical biaxially stretched plastic film of the present disclosure, it is preferable to use the optical biaxially stretched plastic film of the present disclosure as the transparent protective plate on the light emitting side.

<Polarizer>

Examples of the polarizer include a sheet-type polarizer formed by stretching a film stained with iodine or the like (such as polyvinyl alcohol films, polyvinyl formal films, polyvinyl acetal films, and ethylene-vinyl acetate copolymer saponification films), a wire grid polarizer consisting of many metal wires aligned in parallel, a coated polarizer coated with lyotropic liquid crystal and dichroic guest-host material, and a multilayer thin film-type polarizer. Such a polarizer may be a reflective polarizer having a function of reflecting polarization components that do not transmit.

The polarizer preferably has a degree of polarization of 99.00% or more and an average transmittance of 35% or more, more preferably a degree of polarization of 99.90% or more and an average transmittance of 37% or more, further preferably a degree of polarization of 99.95% or more and an average transmittance of 40% or more. In this description, the average transmittance means an average of spectral transmittances at a wavelength of 400 nm or more and 700 nm or less. The average transmittance is measured at a wavelength interval of 5 nm.

The polarizer is preferably disposed so that the absorption axis thereof is substantially parallel or substantially perpendicular to any one side of a sample of the optical biaxially stretched plastic film cut out by the above-described procedure.

[Image Display Device (1)]

The image display device (1) of the present disclosure comprises: a display element; and a plastic film disposed on the light emitting surface side of the display element, wherein the plastic film is the optical biaxially stretched plastic film of the present disclosure.

The optical biaxially stretched plastic film of the present disclosure to be used in the image display device of the present disclosure may have a functional layer on the optical biaxially stretched plastic film. In other words, the optical biaxially stretched plastic film in the image display device of the present disclosure may be a functional film having a functional layer on the optical biaxially stretched plastic film of the present disclosure. The functional layer is preferably disposed on the opposite side of the display element of the optical biaxially stretched plastic film.

<Display Element>

Examples of the display element include liquid crystal display elements, EL display elements (including organic EL elements and inorganic EL elements), and plasma display elements, and further include LED display elements such as Mini LEDs and micro LED display elements, liquid crystal display elements using quantum dots, and LED display elements.

In the case where the display element is a liquid crystal display element, a backlight is required on the surface of the liquid crystal display element opposite to the plastic film.

Further, the image display device may be an image display device having a touch panel function.

Examples of the touch panel include a resistance film type, a capacitance type, an electromagnetic induction type, an infrared type, and an ultrasonic type.

The touch panel function may be one in which a function is added in the display element such as an in-cell touch panel liquid crystal display element or may be one in which a touch panel is placed on the display element.

Figure 7:
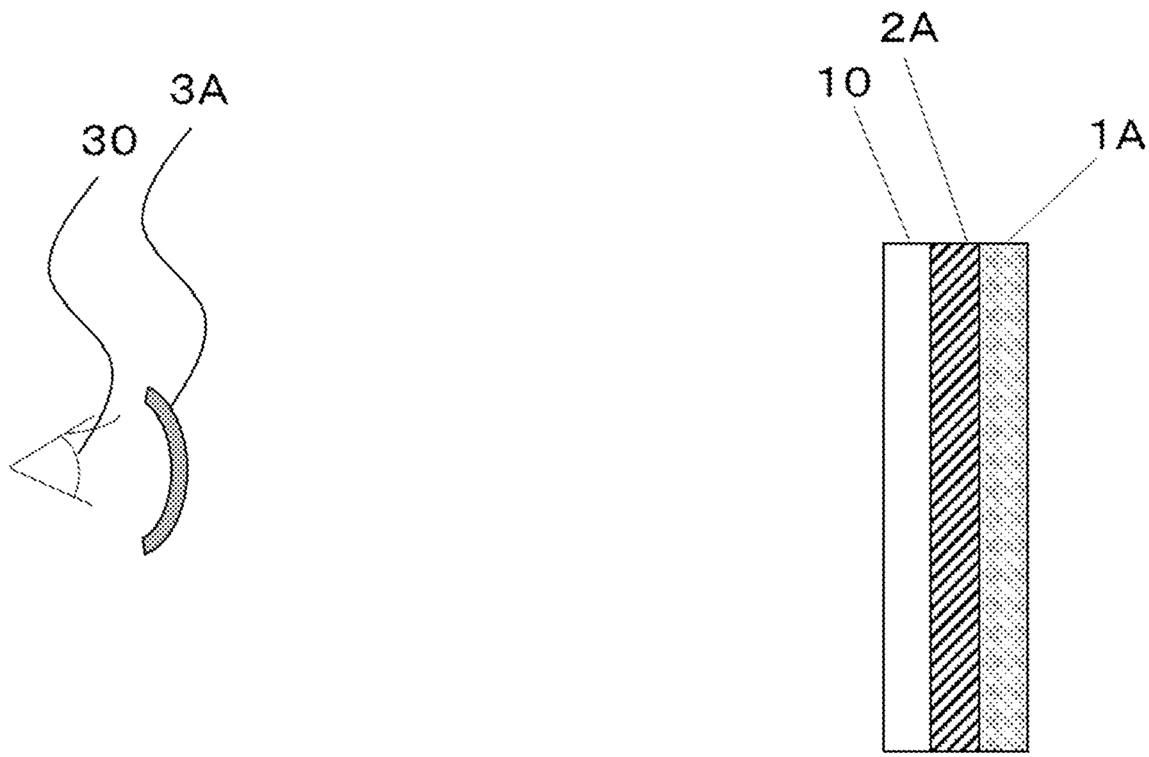
FIG. 7 is a schematic diagram in which the optical biaxially stretched plastic film of the present disclosure is applied to a liquid crystal display element.

FIG. 7 shows a configuration example of the image display device (1) having the optical biaxially stretched plastic film of the present disclosure and a polarizer and the later-described image display device (2). In FIG. 7, 1A denotes a display element, which is a liquid crystal display element or an organic EL element. With respect to 1A, 2A denotes a first polarizer, which is a polarizer attached on the most viewer 30 side in the image display device. 3A denotes a second polarizer, which represents polarized sunglasses or the like.

Figure 8:
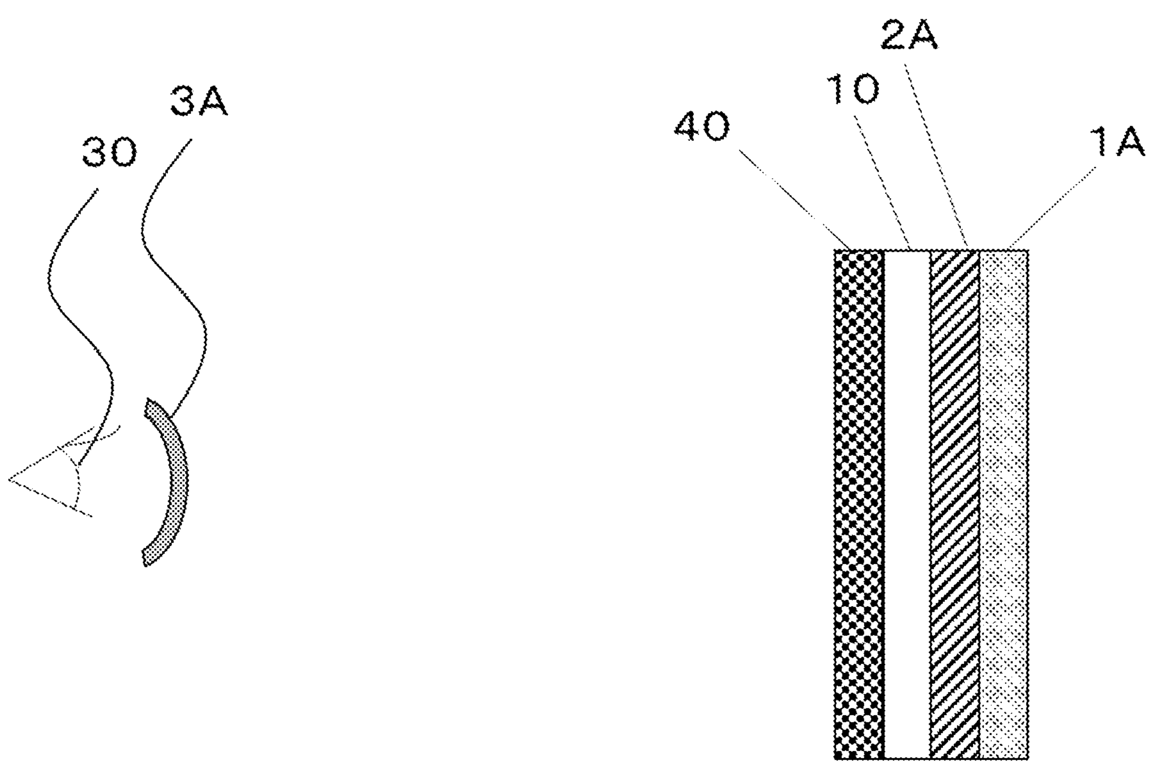
FIG. 8 is a schematic diagram in which the optical biaxially stretched plastic film of the present disclosure is applied to an organic EL element.

FIG. 8 is a schematic diagram of the image display device in which a low-refractive index layer 40 is further attached to FIG. 7.

Examples of the liquid crystal display element include active matrix drive types typified by thin film transistor types, and simple matrix drive types typified by twist nematic types and super twist nematic types.

The optical biaxially stretched plastic film of the present disclosure can be suitably used also for organic EL elements. FIG. 8 shows a schematic diagram of an organic EL element.

In general, an organic EL element forms a luminescent material (organic electroluminescent material) by sequentially laminating a transparent electrode, an organic light emitting layer, and a metal electrode on a transparent base. Here, the organic light emitting layer is a laminate of various organic thin films, and configurations with various combinations are known, such as a laminate of a hole injection layer composed of a triphenylamine derivative or the like and a light emitting layer composed of a fluorescent organic solid such as anthracene, a laminate of such a light emitting layer and an electron injection layer composed of a perylene derivative or the like, and a laminate of such a hole injection layer, such a light emitting layer, and such an electron injection layer, for example.

In an organic EL element, at least one of the electrodes needs to be transparent, in order to extract light from the organic light emitting layer, and a transparent electrode formed of a transparent conductor such as indium tin oxide (ITO) is generally used as an anode. Meanwhile, in order to facilitate electron injection and increase the luminescence efficiency, it is important to use a substance with a small work function as a cathode, and a metal electrode such as Mg—Ag and Al—Li is generally used.

In an organic EL element with such a configuration, the organic light emitting layer is formed of an extremely thin film having a thickness of about 10 nm. Therefore, the organic light emitting layer transmits light almost completely, like the transparent electrode. As a result, the light that is incident from the surface of the transparent base when light is not emitted, transmitted through the transparent electrode and the organic light emitting layer, and reflected on the metal electrode is again emitted to the surface side of the transparent base, and therefore the display surface of the organic EL display device looks like a mirror surface when visually recognized from the outside.

However, the mirror surface of the metal electrode can be completely shielded by combining a birefringent layer such as a λ/4 phase difference plate (not shown) and a polarizer (first polarizer) and adjusting the angle formed by the polarization directions of the polarizer and the birefringent layer to π/4.

That is, only the linearly polarized light component of the external light incident on the organic EL display device is transmitted by the polarizer. The linear polarization is generally elliptically polarized by the birefringent layer but is circularly polarized, when the birefringent layer is a λ/4 phase difference plate, and the angle formed with the polarization direction of the polarizer is λ/4. The circularly polarized light is transmitted through the transparent base, the transparent electrode, and the organic thin film, reflected on the metal electrode, again transmitted through the organic thin film, the transparent electrode, and the transparent base, and again linearly polarized by the λ/4 phase difference plate. Then, the linearly polarized light cannot be transmitted though the polarizer since it is orthogonal to the polarization direction of the polarizer. As a result, the mirror surface of the metal electrode can be shielded completely.

2A denotes a polarizer (first polarizer), which is the polarizer attached on the most viewer side in the image display device.

The optical biaxially stretched plastic film of the present disclosure is disposed on the image display device between the first polarizer and the polarized sunglasses 3A (second polarizer). The optical biaxially stretched plastic film and the first polarizer may be laminated via pressure-sensitive adhesive layers (not shown; hereinafter, the same applies).

The pressure-sensitive adhesive to be used for the adhesive layers of the present disclosure is not specifically limited, and those using acrylic polymers, silicone polymers, polyester, polyurethane, polyamide, polyether, fluorine, and rubber polymers as a base polymer can be appropriately selected for use, for example. The pressure-sensitive adhesive is required to have excellent adhesive properties such as optical transparency, moderate wettability, cohesiveness, and adhesiveness, weather resistance, and heat resistance. Further for preventing foaming and peeling due to moisture absorption, deterioration of optical properties due to thermal expansion difference, and warpage of liquid crystal cells, ensuring formability of high-quality and durable image display devices and the like, a pressure-sensitive adhesive layer having a low hygroscopicity and excellent heat resistance is required. Acrylic pressure-sensitive adhesives are preferable to satisfy these requirements.

Such a pressure-sensitive adhesive may contain additives such as natural resins, synthetic resins, tackiness-imparting resins, glass fibers, glass beads, metal powders, pigments, colorants, and antioxidants. Further, the pressure-sensitive adhesive layer may exhibit light diffusivity by containing fine particles.

The application of the aforementioned pressure-sensitive adhesive to the polarizing plate of the present disclosure is not specifically limited, and an appropriate method can be employed. Examples thereof include a method of preparing about 10 mass % or more and 40 mass % or less of a pressure-sensitive adhesive solution in which a base polymer or its composition is dissolved or dispersed in an appropriate single solvent such as toluene and ethyl acetate or a mixture solvent and directly applying it onto the polarizing plate of the present disclosure by an appropriate development method such as a casting method and coating method, or a method of forming a pressure-sensitive adhesive layer onto a releasable base film according to this method and transferring it to the polarizing plate of the present disclosure.

As the coating method, various methods such as gravure coating, bar coating, roll coating, reverse roll coating, and comma coating can be employed, but gravure coating is most common.

The pressure-sensitive adhesive layer may be provided on one side or both sides of the polarizing plate of the present disclosure as superimposed layers having different compositions, types or the like. Further, in the case where they are provided on both sides, the pressure-sensitive adhesives do not necessarily have the same composition and the same thickness on the front and back sides of the polarizing plate of the present disclosure. The pressure-sensitive adhesive layers can have different compositions and different thicknesses.

Further, the thickness of the pressure-sensitive adhesive layer can be appropriately determined according to the purpose of use, adhesion, or the like, and is generally 1 μm or more and 500 μm or less, preferably 5 μm or more and 200 μm or less, particularly preferably 10 μm or more and 100 μm or less.

<Other Plastic Films>

The image display device of the present disclosure may have other plastic films, as long as the effects of the present disclosure are not inhibited.

The other plastic films are preferably optically isotropic.

Examples of the plastic film disposed on the light emitting surface side of the display element include a plastic film used as a base material for various functional films such as a polarizer protective film, a surface protective film, an antireflection film, a conductive film constituting a touch panel.

[Image Display Device (2)]

<Condition 1B>

The luminance difference between the luminance obtained in the measurement 1B and the luminance obtained in the measurement 2B (L1.n−L2.n) is calculated at 100 measurement points, and the "luminance difference variation 3σ" calculated from the luminance differences at 100 measurement points is 100 or more;

<<Measurement 1B>>

A measurement sample 1B is produced by disposing a first polarizer, the optical biaxially stretched plastic film, and a second polarizer in this order on a display element. In the measurement sample 1B, the slow axis direction of the optical biaxially stretched plastic film is disposed substantially perpendicular to the absorption axis direction of the first polarizer, and the absorption axis of the second polarizer is disposed substantially perpendicular to the absorption axis direction of the first polarizer.

The display element of the measurement sample 1B is displayed in white, and the luminance of the transmitted light emitted from the second polarizer side is measured in any first region at measurement points of 100 in vertical×100 in horizontal set at equal intervals. The results at 100 points in any horizontal row are extracted from the measurement results and are sequentially referred to as the first measurement point to the 100th measurement point, and the luminance at the first measurement point is defined as L1.1, the luminance at the 100th measurement point is defined as L1.100, and the luminance at the n-th measurement point is defined as L1.n;

<<Measurement 2B>>

A measurement sample 2B is produced by disposing the first polarizer and the second polarizer in this order on a display element that is the same as the display element in the measurement 1B. In the measurement sample 2B, the absorption axis of the second polarizer is disposed substantially perpendicular to the absorption axis direction of the first polarizer.

The display element of the measurement sample 2B is displayed in white, and the luminance of the transmitted light emitted from the second polarizer side in a region that substantially coincides with the first measurement region measured at measurement points of 100 in vertical×100 in horizontal set at equal intervals. The results at 100 points in any horizontal row are extracted from the measurement results and are sequentially referred to as the first measurement point to the 100th measurement point, and the luminance at the first measurement point is defined as L2.1, the luminance at the 100th measurement point is defined as L2.100, and the luminance at the n-th measurement point is defined as L2.n; and <Condition 2B>

The in-plane phase difference (Re) is 2500 nm or less.

The image display device of the present disclosure(2) comprises the first polarizer and the optical biaxially stretched plastic film on the light emitting surface of the display element, wherein the slow axis direction of the optical biaxially stretched plastic film is disposed substantially perpendicular to the absorption axis direction of the first polarizer, and the optical biaxially stretched plastic film has a region satisfying <Condition 1B> and <Condition 2B> described above.

The "measurement sample 1B" in the measurement 1B of the image display device (2) means that a second polarizer is disposed on the light emitting surface of the image display device (2). Further, the "measurement sample 2B" in the measurement 2B of the image display device (2) means that the optical biaxially stretched plastic film of the present disclosure is removed from the image display device (2), and a second polarizer is disposed on the light emitting surface side of the first polarizer.

The measurement 1B and the measurement 2B in the image display device (2) of the present disclosure are the same as the measurement 1 and the measurement 2 of the optical biaxially stretched plastic film of the present disclosure, except that the surface light source and the display element are different.

Further, the preferable embodiments of the measurement 1B and the measurement 2B are the same as the preferable embodiments of the measurement 1 and the measurement 2 (for example, the first polarizer is disposed on the display element, and the preferable range of the luminance of the transmitted light emitted from the first polarizer side is the same as the preferable range of the luminance of the transmitted light emitted from the first polarizer side when the first polarizer is disposed on the surface light source). Further, the preferable embodiments of the condition 1B and condition 2B are the same as the preferable embodiments of the condition 1 and condition 2.

<Applications of Image Display Device>

The image display device of the present disclosure is an image display device having a display element, and an optical biaxially stretched plastic film disposed on a light emitting surface side of the display element.

The image display device of the present disclosure may be an image display device to be used indoors or may be an image display device to be used indoors, but an image display device to be used outdoors where the viewer uses polarized sunglasses or polarized goggles is preferable.

Specifically, an image display device used for tablets, smartphones, watches such as smart watch, car navigations, PIDs (public information displays), fishfinders, drone operation screens or the like is preferable. In the case of a portable image display device such as tablets and smartphones, the conditions of external light and the positions of the viewer and the light emitting surface change, and use of the optical biaxially stretched plastic film of the present invention is preferable, since blackouts are less likely to occur. Further, in the case of a stationary image display element device such as PID, the image display device does not move, but the viewer looks at the image display device while moving, and therefore it is required that blackouts do not occur in a wide view angle, and it is preferable to use the optical biaxially stretched plastic film of the present disclosure and a functional film using the same.

As described above, the optical biaxially stretched plastic film of the present disclosure can suppress folding habits remaining and breakage after the folding test. Therefore, the image display device of the present disclosure is preferable in that it can exert a more remarkable effect in the case of a curved image display device or a foldable image display device.

In the case where the image display device is a curved image display device or a foldable image display device, the image display device is preferably an organic EL element.

<Relationship Between Absorption Axis of Polarizing Plate and Slow Axis of Optical Plastic>

The second polarizer corresponds to lenses of polarized sunglasses or polarized goggles. For example, in the case of polarized sunglasses, reflection on the horizontal plane such as water surface is absorbed, the absorption axis is in the horizontal direction. The slow axis of the optical biaxially stretched plastic film of the present disclosure is preferably parallel to the absorption axis of the second polarizer, that is, horizontal or substantially horizontal to the ground. Further, the effects of the present disclosure are exerted to the maximum when the absorption axis of the first polarizer is perpendicular or substantially perpendicular to the absorption axis of the second polarizer, which is therefore preferable. A vertically long image display device for PIDs is obtained by rotating a horizontally long image display device for television by 90 degrees, and therefore the absorption axis of the first polarizer is different by 90 degrees between the image display device for PIDs and the image display device for television in most cases. Therefore, it is particularly preferable that the effects of the present disclosure be exerted to the maximum when the absorption axis of the second polarizer is perpendicular or substantially perpendicular to the first polarizer.

In the case where the slow axis direction in the plane of the optical biaxially stretched plastic film is not uniform, the slow axis direction of the optical biaxially stretched plastic film means the average slow axis direction in the plane of the optical biaxially stretched plastic film.

[Method for Selecting Optical Biaxially Stretched Plastic Film]

The method for selecting an optical biaxially stretched plastic film of the image display device of the present disclosure is a method for selecting an optical biaxially stretched plastic film of an image display device comprising a polarizing plate and an optical biaxially stretched plastic film on a surface of the light emitting surface side of the image display device, the method comprising selecting an optical biaxially stretched plastic film satisfying a determination condition of having a region satisfying the condition 1 and condition 2:

The conditions 1 and 2 are as described above. The method for selecting an optical biaxially stretched plastic film of the image display device of the present disclosure preferably further has additional determination conditions as the determination conditions. Examples of the additional determination conditions include the preferable embodiments of the optical biaxially stretched plastic film of the present disclosure (such as embodiments satisfying the condition 3 and/or the condition 4).

According to the method for selecting an optical film of a display device of the present disclosure, it is possible to efficiently select an optical film that can suppress blackouts when observed through polarized sunglasses and improve the workability.

EXAMPLES

Next, the present disclosure will be described further in detail by way of Examples, but the present disclosure is not limited by these examples at all.

1. Measurement and Evaluation

The following measurement and evaluation were performed in an atmosphere at a temperature of 23° C.±5° C. and a relative humidity of 40% RH or more and 65% RH or less. Further, each sample was exposed to the atmosphere for 30 minutes or more before the measurement and evaluation.

1-1. Luminance

A measurement sample of 120 mm in vertical×120 mm in horizontal was cut out from an optical biaxially stretched plastic film.

A measurement sample 1 was produced by stacking the later-described surface light source, a first polarizer (hereinafter, the polarizer used was product number: MUHD40S of MeCan Imaging Inc., "degree of polarization: 99.97%, average transmittance: 40.0%"), the biaxially stretched plastic film cut out, and a second polarizer in this order. The slow axis direction of the optical biaxially stretched plastic film was disposed perpendicular to the absorption axis direction of the first polarizer, and the absorption axis of the second polarizer was disposed perpendicular to the absorption axis direction of the first polarizer.

The surface light source of the measurement sample 1 was displayed in white.

The measuring device used was product number "Prometric PM1423-1, imaging luminance meter, CCD resolution: 1536×1024" of Cybernet Systems CO., LTD. (currently, Radiant Vision Systems, LLC). The measurement sample 1 and the imaging luminance meter were set in the positional relationship shown in FIG. 1. The distance between the camera and the surface light source was 750 mm.

In the measurement sample 1, a region of 100 mm in vertical×100 mm in horizontal was used as a measurement region, inside 10 mm in the vertical and horizontal directions from the contour of the biaxially stretched plastic film cut out.

Then, the following "Setting before measurement" and "Adjustment of exposure time" were performed, and then the following "Measurement and analysis" was performed. The measurement was performed in a dark room environment.

<Setting Before Measurement>

(1) The imaging luminance meter was connected to a personal computer, and a software (RADIANT IMAGING Prometric 9.1 Version9.1.32) attached to the imaging luminance meter in the personal computer was started.

(2) When the software was started, the CCD temperature in the imaging luminance meter was automatically adjusted to a blue display (−10° C.). Wait until the CCD temperature stabilized at −10° C.

(3) "Color, 1×1 binning" was specified in "Measurement setup" of the software.

(4) The dial of the lens aperture setting was set to 1.8, and the second polarizer was focused on.

<Adjustment of Exposure Time>

The "Adjustment of exposure time" of the software was performed. Specifically, the "adjust" button was pressed in the order of Y (green), X (red), and Z (blue), and then the settings were saved. The exposure time was adjusted each time the sample was measured.

<Measurement and Analysis>

The "Focus mode" on the toolbar was selected, and it was confirmed that the measurement target region was reflected in the image in the focus mode.

The "Measurement execution" was pressed, to carry out the measurement. The measurement results were saved.

From the toolbar, "Tools" and "Measurement data processing" were selected. Then, "Cut range" was selected from the pull-down menu of "Select processing content". Then, a range corresponding to 100 mm×100 mm of the sample was specified and saved. The data saved above was referred to as "saved data 1".

The saved data 1 was opened. Then, "Tools" and "Export measurement data" were selected from the toolbar. Then, "luminance" was selected as the data type, and excel data was exported with a resolution of "X:100, Y:100 and an output format of "XY Table".

Luminance data at measurement points of 100 in vertical×100 in horizontal were obtained by the aforementioned procedure. Data at 100 points in any horizontal row were extracted from the measurement results, to obtain luminance data (L1.n: the luminance in the measurement 1) at 100 points shown in FIG. 3.

In the measurement 1, measurement points with a luminance variation of over 30% with adjacent measurement points were excluded from the measurement results since they are based on local defects in the members constituting the measurement sample 1. The same applies to the later-described measurement 2.

As the surface light source, the following three types were used.

The luminance shown below was the average of the luminances determined at 100 measurement points under the condition that the second polarizer was further removed from the measurement 2. The 3σ of the luminance shown below was calculated from the luminances obtained at the 100 points.

The color temperature of the surface light source was measured using product number "Prometric PM1423-1, imaging luminance meter, CCD resolution: 1536×1024" of Cybernet Systems CO., LTD. (currently, Radiant Vision Systems, LLC). The color temperature data of the surface light source can be obtained in the same manner as in the measurement of luminance except that the type of data to be exported was changed from "luminance" to "correlated color temperature". Then, the average of the color temperatures at a total of five points including four points 10 mm advanced from the four corners of the measurement region of 100 mm×100 mm toward the center and the center of the sample was taken as the color temperature of each surface light source.

<LED light source (LED)>

A LED light source (product name "Dbmier A4S" of GraphicsPower, thin 4.5 mm USB power supply (278×372×4.5 mm) was used as a surface light source.

Luminance: 23021

3σ of luminance: 6917

Color temperature when displayed in white: 10526 K

<RGB display OLED (OLED)>

A product from Samsung, product name "galaxy Note 4", from which the polarizer was removed was displayed in white and used as a surface light source.

Luminance: 32995

3σ of luminance: 2433

Color temperature when displayed in white: 6962 K

<LCD Display (LCD)>

A product from EIZO, product name "EV2450Z", from which the polarizer on the outermost surface of the display element was removed was displayed in white and used as a surface light source.

Luminance: 36907

3σ of luminance: 1564

Color temperature when displayed in white: 7772 K

The measurement 2 was performed in the same manner as in the measurement 1 except that the optical biaxially stretched plastic film was removed, to measure the luminance (L2.n: luminance in the measurement 2). The second measurement region that was the measurement region in the measurement 2 substantially coincided with the first measurement region that was the measurement region in the measurement 1.

1-2. Calculation of "Luminance Difference Variation 3σ"

Using the luminances L1.n and L2.n measured at the 100 points, the luminance differences (L1.n−L2.n) was calculated. Of the luminance differences obtained at the 100 points, negative values were removed, to calculate the "luminance difference variation 3σ". Since the first polarizer and the second polarizer are disposed by crossed Nicols, the luminance L2.n is generally low. Since light leaks locally from the crossed Nicols at the measurement points where the luminance difference is negative, and the measurement points can be said to be abnormal where the L2.n exhibits a high value, they are excluded from the calculation of 36.

In Examples and Comparative Examples, the number of luminance measurement points used in calculating the luminance difference variation 36 was 80 or more in any case.

1-2. In-Plane Phase Difference (Re), Phase Difference in Thickness Direction (Rth), and Slow Axis Variation A measurement sample of 100 mm in vertical×100 mm in horizontal was cut out from the optical biaxially stretched plastic film. The flow direction (MD direction) of the measurement sample was taken as the vertical direction, and the width direction (TD direction) of the plastic film was taken as the horizontal direction. The in-plane phase difference, the phase difference in the thickness direction, and the slow axis direction were measured at a total of five points including four points 10 mm advanced from the four corners of each the sample toward the center and the center of the sample. Table 1 shows the average of Re1 to Re5 or the like calculated from the measurement results. The measuring device used was product name "RETS-100 (measurement spot: diameter 5 mm)", available from Otsuka Electronics Co., Ltd. The slow axis direction was measured in the range of 0 degrees or more and 90 degrees or less with the flow direction (MD direction) of the plastic film taken as 0 degrees as a reference.

1-3. Evaluation of Blackouts

Blackouts were evaluated by assessing the readability of 18-point characters. The evaluation was performed in a bright room environment with a luminance on the surface of the image display device of 300 lux or more and 750 lux or less in the state where the power of image display device was turned off.

The power of the image display device was turned on, 18-point characters were displayed in black on a white background, and twenty evaluators (five from each age group in the 20s, 30s, 40s, and 50s) observed them from a distance of about 750 mm away from the image display device and evaluated whether or not the characters were readable. The sight lines of the evaluators were adjusted to the height of the image display device. Further, the evaluators were positioned in the front of the image display device. Those that could be read by 15 or more and 20 or less were evaluated as "A", those that could be read by 10 or more and 14 or less were evaluated as "B", and those that could be read by 9 or less were evaluated as "C".

1-4. Foldability

<Td Direction>

From the optical biaxially stretched plastic film, a strip-shaped sample with a short side (TD direction) of 30 mm×a long side (MD direction) of 100 mm was cut out. Both ends on the short side (30 mm) of the sample were fixed to a durability tester (product name: "DLDMLH-FS", available from YUASA SYSTEM CO., LTD.) (the areas 10 mm from the tips were fixed), and a repeated folding test of 180 degree folding was performed 100,000 times. The folding speed was 120 times per minute. A more detailed technique of the folding test was as follow. The TD direction almost coincided with the average of the slow axis direction.

After the folding test, the strip-shaped sample was placed on a horizontal table, and the angle at which the edge of the sample rise from the table was measured. Table 1 shows the results. If the sample broke in the middle of the test, it was shown as "broken".

<Md Direction>

From the optical biaxially stretched plastic film, a strip-shaped sample with a short side (MD direction) of 30 mm×a long side (TD direction) of 100 mm was cut out and was subjected to the same evaluation as above.

<Details of Folding Test>

First, a side portion 10C of the plastic film 10 and a side portion 10D facing the side portion 10C were respectively fixed by fixing portions 60 disposed in parallel in the repeated folding test, as shown in FIG. 6(A). Each fixing portion 60 was slidable in the horizontal direction.

Then, the fixing portions 60 were moved so as to come close to each other, so that the plastic film 10 was deformed to be folded, as shown in FIG. 6(B). Further, as shown in FIG. 6(C), the fixing portions 60 were moved to the positions where the interval between the two side portions facing each other fixed by the fixing portions 60 of the plastic film 10 was 10 mm, and then the fixing portions 60 were moved in the reverse direction to eliminate the deformation of the plastic film 10.

As shown in FIG. 6(A) to FIG. 6(C), the plastic film 10 can be folded 180 degrees by moving the fixing portions 60. Further, the interval between the two side portions facing each other of the optical film 10 can be adjusted to 10 mm by performing the repeated folding test so that a bent portion 10E of the plastic film 10 does not protrude from the lower ends of the fixing portions 60 and controlling the interval when the fixing portions 60 are closest to each other to 10 mm.

Examples 1 to 31

1 kg of PET (melting point 258° C., absorption center wavelength: 320 nm) and 0.1 kg of ultraviolet absorber (2,2'-(1,4-phenylene)bis(4H-3,1-benzoxazinone-4-one) were melt-mixed in a kneader at 280° C. to produce pellets containing an ultraviolet absorber. The pellets and PET having a melting point of 258° C. were put into a single-screw extruder, melt-kneaded at 280° C., extruded from a T die, and cast onto a cast drum with the surface temperature controlled to 25° C., to obtain a casting film. The amount of the ultraviolet absorber in the casting film was 1 part by mass with respect to 100 parts by mass of PET.

The casting film obtained was heated by a roll group set to 95° C., and the film was stretched 3.3 times in the flow direction, while heating both the front and back sides of the film with a radiation heater so that the film temperature at the 250 mm point of the stretching section 400 mm (the start point is the stretching roll A, the end point is the stretching roll B, and the stretching rolls A and B each have two nip rolls) was 103° C. and then cooled once. During heating with the radiation heater, a wind of 92° C. and 4 m/s was blown toward the film from the opposite side of the film of the radiation heater, to generate turbulent flow on the front and back sides of the film, so that the temperature uniformity of the film was disturbed.

Subsequently, both sides of the uniaxially stretched film are subjected to corona discharge treatment in air to set the wetting tension of the base film to 55 mN/m, and the corona discharge-treated surfaces on both sides of the film were in-line coated with "a coating solution for slippery layers, containing a polyester resin with a glass transition temperature of 18° C., a polyester resin with a glass transition temperature of 82° C., and silica particles with an average particle size of 100 nm", to form a slippery layer.

Then, the uniaxially stretched film is guided to a tenter, preheated with hot air at 95° C., and then stretched 4.5 times in the film width direction at a temperature of 105° C. for the first stage and 140° C. for the second stage. Here, when the transverse stretching section is divided into two, the stretched amount of the film (film width at measurement point−film width before stretching) at the midpoint of the transverse stretching section was stretched in two steps so as to be 80% of the stretched amount at the end of the transverse stretching section. The transversely stretched film was heated, as it was, in the tenter stepwise with hot air from 180° C. to a heat treatment temperature of 245° C., followed by 1% relaxation treatment in the width direction under the same temperature conditions, further quenching to 100° C., and then 1% relaxation treatment in the width direction. Thereafter, the film was wound up, to obtain a biaxially stretched polyester film 1 (biaxially stretched polyester film to be used in Examples 1 to 3) with a thickness of 40 nm.

Table 1 summarizes the physical property values of the biaxially stretched polyester film 1 obtained and the evaluations of "luminance difference variation" and "blackout evaluation (readability)" when the three types of surface light sources are used.

TABLE 1

| | | Example | | |
|---|---|---|---|---|
| | | 1 | 2 | 3 |
| Surface light source | | LED | OLED | LCD |
| Average luminance | | 249 | 252 | 274 |
| Condition 1: Luminance difference variation 3σ | | 231 | 264 | 429 |
| In-plane phase difference (nm) | Re1 | | 459 | |
| | Re2 | | 453 | |
| | Re3 | | 450 | |
| | Re4 | | 458 | |

TABLE 1-continued

| | | Example 1 | Example 2 | Example 3 |
|---|---|---|---|---|
| | Re5 | | 455 | |
| | Condition 2: Average of Re | | 455 | |
| Condition 3: Difference between maximum value and minimum value of Re (nm) | | | 9 | |
| Slow axis direction (degree) | D1 | | 82.00 | |
| | D2 | | 86.00 | |
| | D3 | | 86.00 | |
| | D4 | | 85.00 | |
| | D5 | | 79.00 | |
| | Condition 4: Maximum value − minimum value | | 7.00 | |
| Phase difference in thickness direction (nm) | Rth1 | | 5900 | |
| | Rth2 | | 6015 | |
| | Rth3 | | 6061 | |
| | Rth4 | | 5966 | |
| | Rth5 | | 5990 | |
| | Average of Rth | | 5986 | |
| Re/Rth | Re1/Rth1 | | 0.078 | |
| | Re2/Rth2 | | 0.075 | |
| | Re3/Rth3 | | 0.074 | |
| | Re4/Rth4 | | 0.077 | |
| | Re5/Rth5 | | 0.076 | |
| | Average of Re/Rth | | 0.076 | |
| | Foldability (TD) | | 10 degree | |
| | Foldability (MD) | | 10 degree | |
| | Blackout evaluation (readability) | A | A | A |

The biaxially stretched polyester films of Examples had good readability, regardless of the surface light source. Further, the biaxially stretched polyester film 1 had good foldability.

Comparative Examples 1 to 8

Blackouts (readability) were evaluated in the same manner as in Example 1, except that the following comparative films 1 to 3 were used as polyester films. Further, the surface light sources shown in Tables 2 to 4 were used. Tables 2 to 4 show the results.

<Comparative Film 1>

A product from TOYOBO CO., LTD., product name "Cosmoshine A4300, biaxially stretched polyester film" (film thickness: 188 μm, Re average: 8259 nm)

<Comparative Film 2>

A product from TOYOBO CO., LTD., product name "Cosmoshine TA048, uniaxially stretched film" (film thickness: 80 μm, Re average: 10302 nm)

<Comparative Film 3>

A product from TOYOBO CO., LTD., product name "Cosmoshine A4300 biaxially stretched polyester film" (film thickness: 100 μm, Re average: 4207 nm)

TABLE 2

| | Comparative Example 1 | Comparative Example 2 |
|---|---|---|
| | Biaxially stretched film | |
| | Comparative film 1 | Comparative film 2 |
| Surface light source | LED | LED |
| Average luminance | 59 | 34 |
| Condition 1: Luminance difference variation 3σ | 49 | 65 |
| Blackout evaluation (readability) | C | C |

TABLE 3

| | Comparative Example 3 | Comparative Example 4 | Comparative Example 5 |
|---|---|---|---|
| | Biaxially stretched film | | |
| | Comparative film 1 | Comparative film 2 | Comparative film 3 |
| Surface light source | OLED | OLED | OLED |
| Average luminance | 24 | 48 | 72 |
| Condition 1: Luminance difference variation 3σ | 79 | 38 | 95 |
| Blackout evaluation (readability) | C | C | C |

TABLE 4

| | Comparative Example 6 | Comparative Example 7 | Comparative Example 8 |
|---|---|---|---|
| | Biaxially stretched film | | |
| | Comparative film 1 | Comparative film 2 | Comparative film 3 |
| Surface light source | LCD | LCD | LCD |
| Average luminance | 10 | 16 | 31 |
| Condition 1: Luminance difference variation 3σ | 52 | 28 | 77 |
| Blackout evaluation (readability) | C | C | C |

In Comparative Examples 1 to 8, readability was low, and blackouts occurred in any case.

Example 4

The functional film of Example 4 was produced by further laminating a low-refractive index layer with a reflectance of 0.15% as a functional layer on the optical biaxially stretched plastic film of Example 1. The "luminance difference variation 3σ" and blackouts were evaluated in the same manner as in Example 1, except that the functional film of Example 4 was used instead of the optical biaxially stretched plastic film of Example 1. The surface light source shown in Table 5 was used. Table 5 shows the results.

TABLE 5

| | Example 4 |
|---|---|
| Surface light source | LED |
| Average luminance | 186 |
| Condition 1: Luminance difference variation 3σ | 153 |
| Blackout evaluation (readability) | A |

As shown in Table 5, the functional film of Example 4 had good readability.

Further, even when the reflectance of the low-refractive index layer of Example 4 was changed to 0.65%, 1.00%, or 1.65%, the readability was good in the same manner as in Example 4.

Examples 5 to 7

A biaxially stretched polyester film 2 used in Examples 5 to 7 was obtained in the same manner as in the biaxially stretched polyester film 1, except that the stretch ratio in the width direction was changed from 4.5 times to 4.9 times.

Table 6 summarizes the physical property values of the biaxially stretched polyester film 2 obtained and the evaluations of "luminance difference variation" and "blackout evaluation (readability)" when the three types of surface light sources are used.

TABLE 6

| | | Example | | |
|---|---|---|---|---|
| | | 5 | 6 | 7 |
| Surface light source | | LED | OLED | LCD |
| Average luminance | | 249 | 252 | 274 |
| Condition 1: Luminance difference variation 3σ | | 180 | 188 | 287 |
| In-plane phase difference (nm) | Re1 | | 1181 | |
| | Re2 | | 1144 | |
| | Re3 | | 1176 | |
| | Re4 | | 1134 | |
| | Re5 | | 1127 | |
| Condition 2: Average of Re | | | 1152 | |
| Condition 3: Difference between maximum value and minimum value of Re (nm) | | | 53 | |
| Slow axis direction (degree) | D1 | | 71.64 | |
| | D2 | | 68.36 | |
| | D3 | | 65.11 | |
| | D4 | | 71.13 | |
| | D5 | | 69.64 | |
| Condition 4: Maximum value − minimum value | | | 6.53 | |
| Foldability (TD) | | | 10 degree | |
| Foldability (MD) | | | 11 degree | |
| Blackout evaluation (readability) | | A | A | A |

As shown in Table 6, the readability was good in Examples 5 to 7, regardless of the surface light source. Further, the biaxially stretched polyester film 2 had good foldability.

Reference Examples 1 and 2

As an optical plastic film of Reference Example 1, a commercially available biaxially stretched polyester film, product name "Cosmoshine A4100", TOYOBO CO., LTD., thickness: 50 μm, Re average: 2202 nm) was prepared.

Further, as an optical plastic film of Reference Example 2, a commercially available uniaxially stretched polyester film, product name "Cosmoshine TA048", TOYOBO CO., LTD., thickness: 80 μm) was prepared.

Using the polyester films of Reference Examples 1 and 2, the foldability was evaluated in the same manner as in Examples. Table 7 shows the results.

TABLE 7

| | | Reference 1 | Example 2 |
|---|---|---|---|
| In-plane phase difference (nm) | Re1 | 2181 | 8125 |
| | Re2 | 2196 | 8287 |
| | Re3 | 2204 | 8221 |
| | Re4 | 2210 | 8321 |
| | Re5 | 2218 | 8329 |
| Condition 2: Average of Re | | 2202 | 8257 |
| Condition 3: Difference between maximum value and minimum value of Re (nm) | | 37 | 204 |
| Slow axis direction (degree) | D1 | 58.37 | 89.51 |
| | D2 | 58.06 | 89.44 |
| | D3 | 58.24 | 89.55 |
| | D4 | 58.05 | 89.87 |
| | D5 | 56.88 | 89.55 |
| Condition 4: Maximum value − minimum value | | 1.49 | 0.43 |

TABLE 7-continued

| | | Reference 1 | Example 2 |
|---|---|---|---|
| Phase difference in thickness direction (nm) | Rth1 | 8017 | 8240 |
| | Rth2 | 7955 | 6883 |
| | Rth3 | 7869 | 7176 |
| | Rth4 | 7925 | 7890 |
| | Rth5 | 8014 | 7862 |
| | Average of Rth | 7956 | 7610 |
| Re/Rth | Re1/Rth1 | 0.272 | 0.986 |
| | Re2/Rth2 | 0.276 | 1.204 |
| | Re3/Rth3 | 0.280 | 1.146 |
| | Re4/Rth4 | 0.279 | 1.055 |
| | Re5/Rth5 | 0.277 | 1.059 |
| | Average of Re/Rth | 0.277 | 1.090 |
| Foldability (TD) | | 0 degree | Breakage |
| Foldability (MD) | | 30 degree | 55 degree |

It can be confirmed from the results of Table 7 that the biaxially stretched polyester films of Examples had good foldability as compared with the uniaxially stretched polyester film and the general biaxially stretched film.

REFERENCE SIGNS LIST

1: Surface light source
1A: Display element
2: First polarizer
2A: Polarizer on most viewer side (first polarizer)
3: Second polarizer
3A: Polarized sunglasses (second polarizer)
4: Measurement sample 1
5: Measurement sample 2
10: Optical biaxially stretched plastic film
10C: Side portion of optical biaxially stretched plastic film 10
10D: Side portion corresponding to 10C
10E: Bent portion of optical biaxially stretched plastic film 10
20: Imaging luminance meter
21: Measurement sample 1-1
22: Measurement sample 1-2
23: Measurement sample 1-3
24: Diagonal line
30: Viewer
40: Low-refractive index layer
60: Fixing portions disposed parallel to each other
Re1 to 5: Measurement points in condition 2

The invention claimed is:

1. An optical biaxially stretched plastic film comprising a region satisfying <Condition 1>, <Condition 2>, and <Condition 4> below:

<Condition 1>

Measurement 1 below and Measurement 2 below are conducted;

<<Measurement 1>> a measurement sample 1 includes a first polarizer, the optical biaxially stretched plastic film, and a second polarizer disposed in this order on a surface light source with a slow axis direction of the optical biaxially stretched plastic film disposed substantially perpendicular to an absorption axis direction of the first polarizer, and an absorption axis of the second polarizer is disposed substantially perpendicular to the absorption axis direction of the first polarizer, the surface light source of the measurement sample 1 is displayed in white having a color temperature in a range of 5000K to 13000K, and luminance of transmitted light emitted from the second polarizer side is measured for a first region defined by 100 vertical columns of measurement sections×100 horizontal rows of measurement sections set at equal intervals;

a size of the first region is 100 mm in vertical and ×100 mm in horizonal; and luminance measurement results for the first region at 100 measurement sections in any one of the horizontal rows of the first region are extracted from the luminance measurement results and are sequentially identified as a first measurement point of Measurement 1 to a 100th measurement point of Measurement 1, with the luminance at the first measurement point of Measurement 1 defined as L1.1, the luminance at the 100th measurement point of Measurement 1 defined as L1.100, and the luminance at a n-th measurement point of Measurement 1 defined as L1.n;

<<Measurement 2>> a measurement sample 2 includes the first polarizer and the second polarizer disposed in this order on the surface light source used in the Measurement 1 with the absorption axis of the second polarizer disposed substantially perpendicular to the absorption axis direction of the first polarizer, the surface light source of the measurement sample 2 is displayed in white having the same color temperature as that for Measurement 1, and luminance of transmitted light emitted from the second polarizer side is measured for a second region defined by 100 vertical columns of measurement sections×100 horizontal rows of measurement sections set at equal intervals with a location of the second region substantially coinciding with a location of the first region; and luminance measurement results for the second region in Measurement 2 at 100 measurement sections in a horizontal row of the second region corresponding in location to the any one of the horizontal rows selected in Measurement 1 are extracted from the luminance measurement results for the second region in Measurement 2 and are sequentially identified as a first measurement point of Measurement 2 to a 100th measurement point of Measurement 2, and the luminance at the first measurement point of Measurement 2 is defined as L2.1, the luminance at the 100th measurement point of Measurement 2 is defined as L2.100, and the luminance at a n-th measurement point of Measurement 2 is defined as L2.n; and when a luminance difference between the luminances obtained for the 100 measurement points of Measurement 1 and the 100 measurement points of Measurement 2 is determined as L1.n–L2.n for each n in a range from 1 to 100, a luminance difference variation 3σ calculated from the luminance differences between the 100 measurement points of Measurement 1 and the 100 measurement points of Measurement 2 is 100 or more and 800 or less;

<Condition 2> wherein when a sample of 100 mm in vertical×100 mm in horizonal is taken from the biaxially stretched plastic film, and an in-plane phase difference (Re) are measured at a total of five points including a center of the sample and four points spaced 10 mm inward from respective ones of four corners of the sample toward the center of the sample, an average value of an in-plane phase difference (Re) at the five points of the sample is 2500 nm or less; and <Condition 4> wherein when slow axis directions are measured at the five points of the sample of 100 mm in vertical×100 mm in horizonal, and the slow axis directions of the five points respectively are defined as D1, D2, D3, D4, and D5, a difference between a maximum value and a minimum value of D1 to D5 is 5.0 degrees or more.

2. The optical biaxially stretched plastic film according to claim 1, wherein the average value of the in-plane phase difference is 520 nm or more and 2500 nm or less.

3. The optical biaxially stretched plastic film according to claim 1, wherein the difference between the maximum value and the minimum value of D1 to D5 is 5.0 degrees or more and 20.0 degrees or less.

4. The optical biaxially stretched plastic film according to claim 1, wherein the in-plane phase difference with respect to a phase difference in a thickness direction is 0.10 or less.

5. The optical biaxially stretched plastic film according to claim 1, having a film thickness of 20 μm or more and 200 μm or less.

6. A functional film comprising a functional layer on one side of the optical biaxially stretched plastic film according to claim 1.

7. A polarizing plate comprising: a polarizer; a first transparent protective plate disposed on one side of the polarizer; and a second transparent protective plate disposed on the other side of the polarizer, wherein at least one selecting from the group consisting of the first transparent protective plate and the second transparent protective plate is the optical biaxially stretched plastic film according to claim 1.

8. An image display device comprising: a display element; and a plastic film disposed on a light emitting surface side of the display element, wherein the plastic film is the optical biaxially stretched plastic film according to claim 1.

9. The image display device according to claim 8, further comprising a polarizer between the display element and the plastic film.

10. The image display device according to claim 8, further comprising a functional layer on the side opposite to the display element of the optical biaxially stretched plastic film.

* * * * *